(12) United States Patent
Yoshioka et al.

(10) Patent No.: US 9,446,938 B2
(45) Date of Patent: Sep. 20, 2016

(54) SOI SUBSTRATE, PHYSICAL QUANTITY SENSOR, SOI SUBSTRATE MANUFACTURING METHOD, AND PHYSICAL QUANTITY SENSOR MANUFACTURING METHOD

(71) Applicant: DENSO CORPORATION, Kariya, Aichi-pref. (JP)

(72) Inventors: Tetsuo Yoshioka, Okazaki (JP); Shinya Asai, Obu (JP); Jyunya Nishida, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/774,194

(22) PCT Filed: Apr. 24, 2014

(86) PCT No.: PCT/JP2014/002298
§ 371 (c)(1),
(2) Date: Sep. 10, 2015

(87) PCT Pub. No.: WO2014/181518
PCT Pub. Date: Nov. 13, 2014

(65) Prior Publication Data
US 2016/0016788 A1    Jan. 21, 2016

(30) Foreign Application Priority Data

May 9, 2013   (JP) ................................. 2013-099583
Mar. 27, 2014 (JP) ................................. 2014-065941

(51) Int. Cl.
*B81B 3/00*    (2006.01)
*G01P 15/125*  (2006.01)
(Continued)

(52) U.S. Cl.
CPC .......... *B81B 3/0086* (2013.01); *B81B 3/0021* (2013.01); *B81C 3/001* (2013.01); *G01L 9/12* (2013.01); *G01P 15/0802* (2013.01); *G01P 15/125* (2013.01); *B81B 2201/025* (2013.01);
(Continued)

(58) Field of Classification Search
None
See application file for complete search history.

(56) References Cited

U.S. PATENT DOCUMENTS 6,242,276 B1   6/2001  Baek et al.
6,428,713 B1   8/2002  Christenson et al.
(Continued)

FOREIGN PATENT DOCUMENTS

JP   H10-84036 A   3/1998
JP   3435647 B2    8/2003
(Continued)

OTHER PUBLICATIONS

Japanese Office Action mailed Feb. 16, 2016 in the corresponding JP application No. 2013-99583.(English translation attached).
(Continued)

*Primary Examiner* — Scott B Geyer
(74) *Attorney, Agent, or Firm* — Posz Law Group, PLC

(57) ABSTRACT

A capacitance type physical quantity sensor includes: a first substrate; and a second substrate bonded to the first substrate through an insulating film. The second substrate includes first and second groove portions at a place of the second substrate facing an end portion of the first and second support units formed on the first substrate on a side opposite to the movable unit. A part of the end portion of the first support unit protrudes over the first groove portion. A part of the end portion of the second support unit protrudes over the second groove portion.

7 Claims, 14 Drawing Sheets

(51) Int. Cl.
  *G01P 15/08* (2006.01)
  *B81C 3/00* (2006.01)
  *G01L 9/12* (2006.01)
  *H01L 29/84* (2006.01)
(52) U.S. Cl.
  CPC *B81B 2201/0264* (2013.01); *B81B 2201/0292* (2013.01); *B81B 2203/0136* (2013.01); *G01P 2015/0814* (2013.01); *H01L 29/84* (2013.01)

(56) References Cited

U.S. PATENT DOCUMENTS

| | | | |
|---|---|---|---|
| 6,450,031 | B1 | 9/2002 | Sakai et al. |
| 2001/0049182 | A1 | 12/2001 | Urakami et al. |
| 2002/0051258 | A1 | 5/2002 | Tamura |
| 2002/0149292 | A1* | 10/2002 | Jerman ................ B81B 3/0086 310/309 |
| 2002/0158301 | A1 | 10/2002 | Urakami et al. |
| 2005/0061075 | A1 | 3/2005 | Sugiura |
| 2005/0081958 | A1 | 4/2005 | Adachi et al. |
| 2007/0232107 | A1 | 10/2007 | Sugiura et al. |
| 2008/0044983 | A1* | 2/2008 | Nagano ............ H01L 21/76251 438/455 |
| 2010/0009514 | A1 | 1/2010 | Lee et al. |
| 2010/0127715 | A1 | 5/2010 | Jeong et al. |
| 2010/0307246 | A1 | 12/2010 | Fuji et al. |
| 2012/0038963 | A1* | 2/2012 | Takubo ................ B81B 3/001 359/224.1 |
| 2012/0142144 | A1 | 6/2012 | Taheri |
| 2012/0326248 | A1 | 12/2012 | Daneman et al. |
| 2013/0147021 | A1 | 6/2013 | Puurunen et al. |
| 2013/0277675 | A1 | 10/2013 | Yoshikawa et al. |
| 2014/0175573 | A1 | 6/2014 | Yoshikawa et al. |

FOREIGN PATENT DOCUMENTS

| | | |
|---|---|---|
| JP | 2003-257805 A | 9/2003 |
| JP | 2010-221307 A | 10/2010 |
| JP | 2012-117972 A | 6/2012 |
| JP | 5000625 B2 | 8/2012 |
| JP | 2013-045791 A | 3/2013 |
| JP | 2013-145154 A | 7/2013 |
| JP | 2013-206991 A | 10/2013 |
| JP | 2014-021044 A | 2/2014 |

OTHER PUBLICATIONS

International Search Report of the International Searching Authority mailed Aug. 5, 2014 for the corresponding international application No. PCT/JP2014/002298(and English translation).

Written Opinion of the International Searching Authority mailed Aug. 5, 2014 for the corresponding international application No. PCT/JP2014/002298 (and English translation).

* cited by examiner

POSITION SHIFT ←

SOI SUBSTRATE, PHYSICAL QUANTITY SENSOR, SOI SUBSTRATE MANUFACTURING METHOD, AND PHYSICAL QUANTITY SENSOR MANUFACTURING METHOD

CROSS REFERENCE TO RELATED APPLICATIONS

This application is a U.S. national stage of International Application No. PCT/JP2014/002298 filed on Apr. 24, 2014 and is based on Japanese Patent Applications No. 2013-99583 filed on May 9, 2013, and No. 2014-65941 filed on Mar. 27, 2014, the disclosures of which are incorporated herein by reference.

TECHNICAL FIELD

The present disclosure relates to a SOI substrate, a physical quantity sensor, a SOI substrate manufacturing method, and a physical quantity sensor manufacturing method.

BACKGROUND ART

In the related art, a sensor using a silicon on insulator (SOI) substrate in which a support substrate, an insulating film, and a semiconductor layer are laminated in this order has been proposed as a capacitance type physical quantity sensor (for example, see Patent literature 1).

Specifically, in this capacitance type physical quantity sensor, a movable unit including multiple movable electrodes which can cause displacement in a predetermined direction is formed on the semiconductor layer. In addition, a first fixed unit which includes a first support unit including a first fixed electrode opposing the movable electrode, and a second fixed unit which includes a second support unit including a second fixed electrode opposing the movable electrode and is disposed on a side opposite to the first fixed unit with the movable unit interposed therebetween, are formed on the semiconductor layer. That is, a pair of the first and second fixed units are formed on the semiconductor layer with the movable unit interposed therebetween.

A recessed portion is formed on a part including parts of the supporting substrate and the insulating film opposing the movable electrodes and the first and second fixed electrodes, and the movable electrodes and the first and second fixed electrodes are in a floating state. In order to cause the first and second fixed electrodes to completely float, end portions of the first and second support units including the first and second fixed electrodes on the movable unit side are partially protruded to the recessed portion.

In such a capacitance type physical quantity sensor, first capacitance is configured of detection capacitance between the movable electrode and the first fixed electrode and parasitic capacitance between the first fixed unit and the supporting substrate. In the same manner as described above, second capacitance is configured of detection capacitance between the movable electrode and the second fixed electrode and parasitic capacitance between the second fixed unit and the supporting substrate. Physical quantity is detected based on a difference between the first capacitance and the second capacitance.

The magnitude of the parasitic capacitance is proportional to areas of portions of the first and second fixed units that are bonded with the supporting substrate through the insulating film. Accordingly, the areas of portions of the first and second fixed units that are bonded with the supporting substrate are set to be equivalent to each other, so that each parasitic capacitance is canceled out when a difference between the first and second capacitance is calculated.

The capacitance type physical quantity sensor is, for example, produced as follows. That is, the insulating film is formed on the supporting substrate and the recessed portion is formed on the supporting substrate and the insulating film. After that, the semiconductor layer configured with a silicon substrate is bonded to the insulating film. A mask is formed on the semiconductor layer and the mask is patterned. Then, reactive ion etching (i.e., RIE) or the like is performed to form the movable electrodes and the first and second fixed electrodes, and the capacitance type physical quantity sensor is produced.

However, in the capacitance type physical quantity sensor, when forming the movable unit and the first and second fixed units, position shift or the like may occur when patterning the mask, and the movable units and the first and second fixed units may be generally shifted from formation expectation areas. For example, when the first fixed unit, the movable unit, and the second fixed unit are generally shifted to the first fixed unit side in an arrangement direction of the first fixed unit, the movable unit, and the second fixed unit, the area of the end portion of the first support unit on the movable unit side which is protruded on the recessed portion is decreased. With respect to this, the area of the end portion of the second support unit on the movable unit side which is protruded on the recessed portion is increased.

That is, the area of the first fixed unit (i.e., first support unit) which is bonded with the supporting substrate through the insulating film is increased and the area of the second fixed unit (i.e., second support unit) which is bonded with the supporting substrate through the insulating film is decreased. That is, the parasitic capacitance formed between the first fixed unit and the supporting substrate is increased and the parasitic capacitance formed between the second fixed unit and the supporting substrate is decreased. Accordingly, when calculating a capacitance difference between the first capacitance and the second capacitance, each parasitic capacitance is not canceled out and a detection error may be generated.

This problem occurs in the same manner even in a capacitance type physical quantity sensor including a cap portion for covering the movable electrodes and the first and second fixed electrodes, in order to prevent attachment of foreign materials to the movable electrodes and the first and second fixed electrodes. That is, in such a capacitance type physical quantity sensor, the cap portion is configured by forming the insulating film on the semiconductor substrate and the semiconductor substrate is bonded to the semiconductor layer through the insulating film. A recessed portion is formed on a part including parts of the semiconductor substrate and the insulating film opposing the movable electrodes and the first and second fixed electrodes. In addition, parasitic capacitance is formed between the first and second support units and the semiconductor substrate, respectively. Accordingly, if position shift occurs due to alignment shift when bonding the semiconductor substrate (i.e., cap portion) and the semiconductor layer, the areas of portions of the first and second fixed units that are bonded with the semiconductor substrate (i.e., cap portion) are different from each other and parasitic capacitance thereof are different from each other.

A SOI substrate in which a thermal oxide film is formed on a first substrate including one surface where a recessed portion is formed, and a second substrate is disposed on one surface side of the first substrate with the thermal oxide film interposed therebetween has been proposed (for example, see Patent literature 2). In the SOI substrate, a silicon substrate is used as the first substrate.

The SOI substrate is produced as follows. First, the recessed portion is formed on one surface of the first substrate. Then, the first substrate is subjected to thermal oxidation to form a thermal oxide film. At that time, the thermal oxide film is formed on the entire surface of the first substrate and also formed on a wall surface of the recessed portion. The SOI substrate is produced by bonding the thermal oxide film formed on one surface of the first substrate and the second substrate.

In the SOI substrate, when forming a sensing unit which outputs a sensor signal according to physical quantity by performing dry etching on the second substrate, the thermal oxide film formed on the recessed portion can be used as an etching stopper. Accordingly, a rough bottom surface of the recessed portion can be prevented. In addition, by forming the thermal oxide film (insulating film) on the recessed portion, the electrical connection between the first substrate and the second substrate through foreign materials can be prevented.

However, in the SOI substrate, when the first substrate is subjected to thermal oxidation to form the thermal oxide film, stress is concentrated on an opening of the recessed portion. Accordingly, the portion of the thermal oxide film formed on the opening of the recessed portion has a greater film thickness than that of the portion thereof formed on other areas. That is, on one surface of the first substrate, the portion of the thermal oxide film formed on the opening of the recessed portion is formed to be swollen, compared to the portion thereof formed on other areas. Accordingly, when the thermal oxide film and the second substrate are bonded to each other in such a state, only the swollen portion of the thermal oxide film is bonded with the second substrate, and thus, adhesiveness of the thermal oxide film and the second substrate is deteriorated.

PRIOR ART LITERATURES

Patent Literature

Patent Literature 1: Japanese Patent No. 3435647
Patent Literature 2: JP-2013-229356 A

SUMMARY OF INVENTION

It is an object of the present disclosure to provide a capacitance type physical quantity sensor which can prevent generation of a detection error and a manufacturing method thereof. It is another object of the present disclosure to provide a SOI substrate which can improve adhesiveness between the thermal oxide film and the second substrate, a physical quantity sensor using the SOI substrate, a SOI substrate manufacturing method, and a physical quantity sensor manufacturing method.

According to a first aspect of the present disclosure, a capacitance type physical quantity sensor includes: a first substrate and a second substrate bonded to the first substrate through an insulating film. The first substrate includes: a movable unit which includes a plurality of movable electrodes that is displaceable in a predetermined direction; a first fixed unit which includes a first support unit having a plurality of first fixed electrodes respectively facing the movable electrodes; a second fixed unit which includes a second support unit having a plurality of second fixed electrodes facing the movable electrodes and disposed on a side opposite to the first support unit by sandwiching the movable unit between the second support unit and the first support unit. At least a portion of the insulating film among the insulating film and the second substrate facing the movable electrode and the first and second fixed electrodes includes a recessed portion. An area where the first support unit is bonded to the second substrate through the insulating film is equivalent to an area where the second support unit is bonded to the second substrate through the insulating film. The capacitance type physical quantity sensor detects physical quantity based on a difference between a capacitance between the movable electrode and the first fixed electrode and a capacitance between the movable electrode and the second fixed electrode.

The second substrate includes a first groove portion at a place of the second substrate facing an end portion of the first support unit on a side opposite to the movable unit and a second groove portion at a place of the second substrate facing an end portion of the second support unit on a side opposite to the movable unit. A part of another end portion of the first support unit on a side of the movable unit protrudes over the recessed portion, and a part of the end portion of the first support unit on the side opposite to the movable unit protrudes over the first groove portion. A part of another end portion of the second support unit on a side of the movable unit protrudes over the recessed portion, and a part of the end portion of the second support unit on the side opposite to the movable unit protrudes over the second groove portion.

In the capacitance type physical volume sensor, since parasitic capacitance formed between the first support unit and the second substrate and parasitic capacitance formed between the second support unit and the second substrate are equivalent to each other, generation of an detection error can be prevented.

According to a second aspect of the present disclosure, a manufacturing method of the capacitance type physical quantity sensor according to the first aspect, the method includes: preparing a semiconductor layer as the first substrate, and preparing a supporting substrate as the second substrate; forming the recessed portion on the second substrate; forming the first and second groove portions on the second substrate; forming a SOI substrate by bonding the first substrate to a surface of the second substrate through the insulating film; and forming the movable unit and the first and second fixed units on the first substrate. The forming of the movable unit and the first and second fixed units includes: forming the first fixed unit that the part of the another end portion of the first support unit on the side of the movable unit protrudes over the recessed portion, and the part of the end portion of the first support unit on the side opposite to the movable unit protrudes over the first groove portion; and forming the second fixed unit that the part of the another end portion of the second support unit on the side of the movable unit protrudes over the recessed portion, and the part of the end portion of the second support unit on the side opposite to the movable unit protrudes over the second groove portion, so that the area where the first support unit is bonded to the second substrate through the insulating film is equivalent to the area where the second support unit is bonded to the second substrate through the insulating film.

According to a third aspect of the present disclosure, a manufacturing method of the capacitance type physical quantity sensor according to the first aspect, the method includes: preparing a SOI substrate in which a semiconductor layer is formed as the first substrate on a supporting substrate through the insulating film, and preparing a semiconductor substrate as the second substrate; forming the movable unit and the first and second fixed units on the first substrate; forming the insulating film on the second substrate; forming the recessed portion at least on the insulating film among the second substrate and the insulating film; forming the first and second groove portions on the second substrate; and bonding the second substrate to the first substrate through the insulating film.

In the bonding, the first and second substrates are bonded to each other in such a manner that the part of the another end portion of the first support unit on the side of the movable unit protrudes over the recessed portion, the part of the end portion of the first support unit on the side opposite to the movable unit protrudes over the first groove portion, the part of the another end portion of the second support unit on the side of the movable unit protrudes over the recessed portion, and the part of the end portion of the second support unit on the side opposite to the movable unit protrudes over the second groove portion, so that the area where the first support unit is bonded to the second substrate through the insulating film is equivalent to the area where the second support unit is bonded to the second substrate through the insulating film.

In the manufacturing method of the second aspect and the third aspect, the part of the end portion of the first support unit on the movable unit side protrudes over the recessed portion and the part of the end portion thereof on the side opposite to the movable unit side protrudes over the first groove portion, and the part of the end portion of the second support unit on the movable unit side protrudes over the recessed portion and the part of the end portion thereof on the side opposite to the movable unit side protrudes over the second groove portion. Accordingly, the area of the portion where the first and second support units are bonded to the second substrate through the insulating film is not changed and the parasitic capacitance is not changed either, even when the position shift has occurred. Therefore, a decrease in the detection accuracy can be prevented.

According to a fourth aspect of the present disclosure, a SOI substrate manufacturing method includes: preparing a first substrate made of a silicon substrate having one surface; forming a recessed portion on the one surface of the first substrate; performing thermal oxidation of the first substrate, and forming a thermal oxide film; and bonding a second substrate to the one surface of the first substrate through the thermal oxide film.

After the forming of the thermal oxide film, when a periphery portion of the one surface of the first substrate around an opening of the recessed portion is set as a boundary area, and an area of the one surface of the first substrate surrounding the boundary area and being greater than the area of the boundary area is set as a periphery area, adjusting of the thermal oxide film to set a thickness of a portion of the thermal oxide film formed in the boundary area to be equal to or smaller than a thickness of a portion of the thermal oxide film formed in the periphery area is performed. The portion of the thermal oxide film formed in the periphery area is bonded with the second substrate in the bonding of the second substrate.

According to the SOI substrate manufacturing method according to the fourth aspect, since the SIO substrate is configured by bonding the portion of the thermal oxide film formed in the periphery area to the second substrate, adhesiveness between the thermal oxide film and the second substrate can be improved.

According to a fifth aspect of the present disclosure, a physical quantity sensor manufacturing method includes: preparing a SOI substrate, which is manufactured by the manufacturing method according to the fourth aspect; and forming a sensing unit on the second substrate, the sensing unit including: a movable unit which has a plurality of movable electrodes being displaceable in a predetermined direction; a first fixed unit which has a first support unit with a plurality of first fixed electrodes respectively facing the movable electrodes; and a second fixed unit which has a second support unit with a plurality of second fixed electrodes respectively facing the movable electrodes, and the second support unit being disposed on a side opposite to the first support unit by sandwiching the movable unit between the second and first support units.

The adjusting of the thermal oxide film in the preparing of the SOI substrate includes: forming a first groove portion at a place of the thermal oxide film facing an end portion of the first support unit on a side opposite to the movable unit, and forming a second groove portion at a place of the thermal oxide film facing an end portion of the second support unit on a side opposite to the movable unit. The forming of the sensing unit includes: forming the first fixed unit in such a manner that a part of another end portion of the first support unit on a side of the movable unit protrudes in a space surrounded by the thermal oxide film and formed on a wall surface of the recessed portion, and a part of the end portion of the first support unit on the side opposite to the movable unit protrudes over the first groove portion; and forming the second fixed unit in such a manner that a part of another end portion of the second support unit on the side of the movable unit protrudes in the space, and a part of the end portion of the second support unit on the side opposite to the movable unit protrudes over the second groove portion, so that an area of a portion of the first support unit bonded to the first substrate through the thermal oxide film is equivalent to an area of a portion of the second support unit bonded to the first substrate through the thermal oxide film.

In the manufacturing method of the physical volume sensor according to the fifth aspect, the area of the portion of the first and second support units bonded to the first substrate through the thermal oxide film is not changed and the parasitic capacitance is not changed either, even when the position shift has occurred. Therefore, a decrease in the detection accuracy can be prevented.

According to a sixth aspect of the present disclosure, a SOI substrate includes: a first substrate that includes one surface and is made of a silicon substrate where a recessed portion is arranged on the one surface; a thermal oxide film that is arranged on the first substrate; and a second substrate that is disposed on the one surface of the first substrate through the thermal oxide film.

A periphery portion of the one surface of the first substrate around the opening of the recessed portion is set as a boundary area. An area of the one surface of the first substrate surrounding the boundary area and being greater than the area of the boundary area is set as a periphery area. A thickness of a portion of the thermal oxide film arranged in the boundary area is set to be equal to or smaller than a thickness of a portion of the thermal oxide film arranged in the periphery area. The second substrate is bonded to the portion of the thermal oxide film arranged in the periphery area. A relaxation space is arranged between the second substrate and a boundary portion, which links a portion of the thermal oxide film arranged on the one surface and a portion of the thermal oxide film arranged on the wall surface of the recessed portion.

In the SOI substrate according to the sixth aspect, when the thermal oxide film is expanded due to a change in the usage environment to a high temperature, the thermal oxide film can be expanded to the alleviation space and generation of thermal stress between the thermal oxide film and the second substrate can be prevented.

According to a seventh aspect of the present disclosure, a physical quantity sensor includes: the SOI substrate according to the sixth aspect; and a sensing unit including: a movable unit which has a plurality of movable electrodes being displaceable in a predetermined direction; a first fixed unit which has a first support unit with a plurality of first fixed electrodes respectively facing the movable electrodes; and a second fixed unit which has a second support unit with a plurality of second fixed electrodes respectively facing the movable electrodes, the second support unit being disposed on a side opposite to the first support unit by sandwiching the movable unit between the second and first support units.

A first groove portion is arranged at a place of the thermal oxide film facing an end portion of the first support unit on a side opposite to the movable unit, and a second groove portion is arranged at a place of the thermal oxide film facing an end portion of the second support unit on the side opposite to the movable unit. A part of another end portion of the first support unit on a side of the movable unit protrudes in a space surrounded by the thermal oxide film arranged on the wall surface of the recessed portion, and a part of the end portion of the first support unit on the side opposite to the movable unit protrudes over the first groove portion. A part of another end portion of the second support unit on the side of the movable unit protrudes in the space, and a part of the end portion of the second support unit on the side opposite to the movable unit protrudes over the second groove portion. An area of a portion of the first support unit bonded to the first substrate through the thermal oxide film is equivalent to an area of a portion of the second support unit bonded to the first substrate through the thermal oxide film.

In the physical volume sensor according to the seventh aspect, since parasitic capacitance formed between the first support unit and the first substrate and parasitic capacitance formed between the second support unit and the first substrate are equivalent to each other, a decrease in detection accuracy can be prevented.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
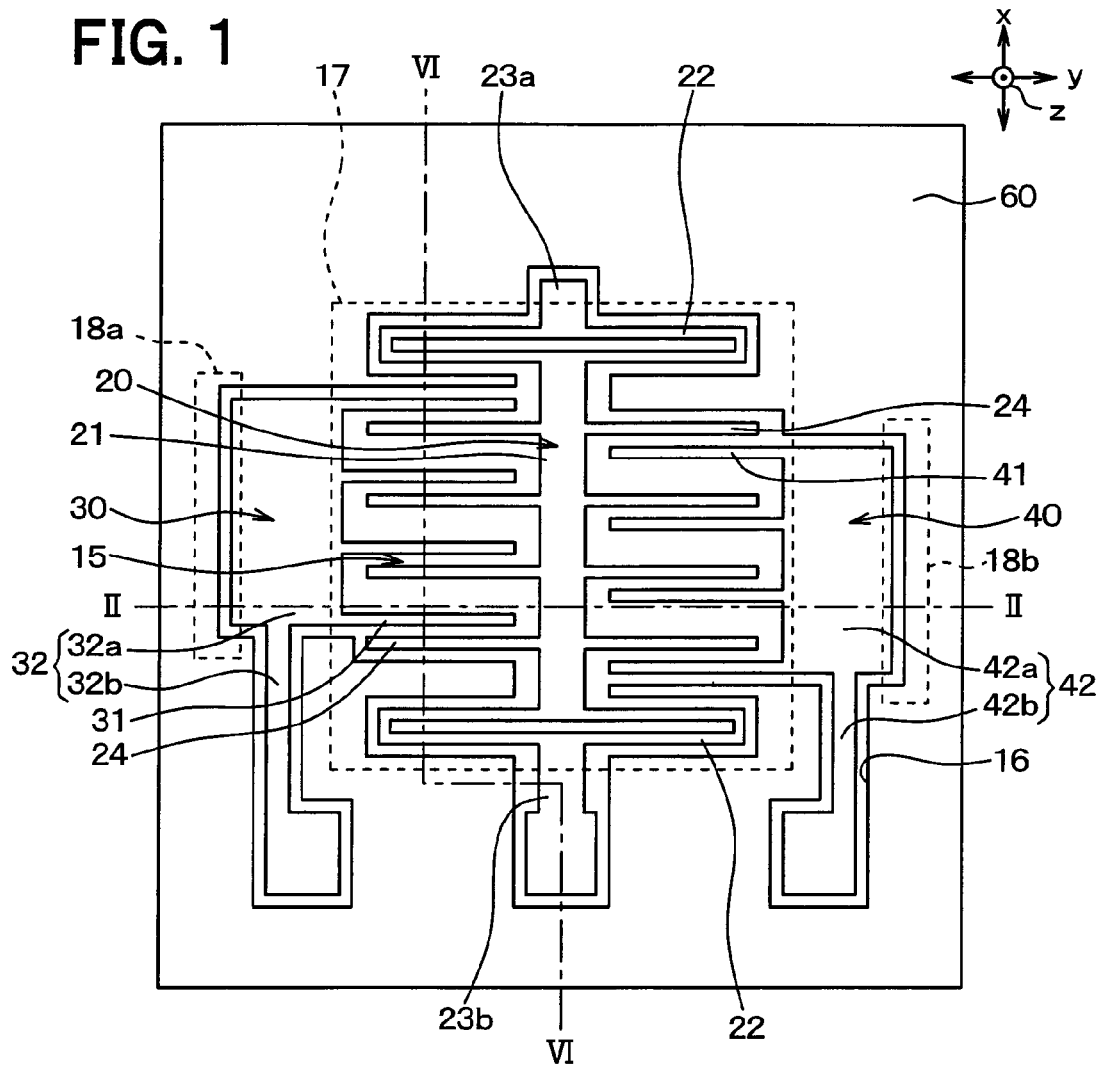
FIG. 1 is a top view of a capacitance type physical quantity sensor of First Embodiment of the present disclosure.

Hereinafter, embodiments of the present disclosure will be described with reference to the drawings. In each of the following embodiments, the description will be provided using the same reference numerals for the same or equivalent portions.

First Embodiment

First Embodiment of the present disclosure will be described with reference to the drawings. In this embodiment, an acceleration sensor in which a sensing unit which detects acceleration is formed will be described as an example of a capacitance type physical quantity sensor.

Figure 2:
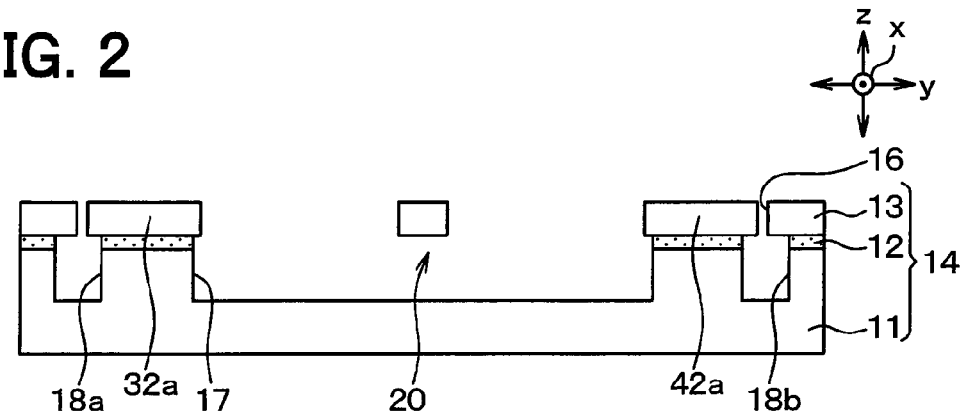
FIG. 2 is a cross-sectional view of a capacitance type physical quantity sensor taken along line II-II of FIG. 1.

As shown in FIG. 1 and FIG. 2, the acceleration sensor of this embodiment is configured using a SOI substrate 14 including a supporting substrate 11, an insulating film 12 which is disposed on the supporting substrate 11, and a semiconductor layer 13 which is disposed on a side opposite to the supporting substrate 11 with the insulating film 12 interposed therebetween.

The supporting substrate 11 and the semiconductor layer 13 is a silicon substrate or the like and the insulating film 12 is $SiO_2$ or the like. In this embodiment, the semiconductor layer 13 corresponds to a first substrate of the capacitance type physical quantity sensor and the supporting substrate 11 corresponds to a second substrate of the capacitance type physical quantity sensor.

A sensing unit 15 subjected to a well-known micromachine process is formed on the SOI substrate 14. Specifically, a movable unit 20 and first and second fixed units 30 and 40 having a beam structure having a comb-tooth shape by forming a groove 16 are formed on the semiconductor layer 13 and a sensing unit 15 which outputs a sensor signal according to acceleration by this beam structure is formed.

Portions of the supporting substrate 11 and the insulating film 12 corresponding to a formation area of the beam structure are removed to form a recessed portion 17. The recessed portion 17 is a component for preventing a movable electrode 24 and first and second fixed electrodes 31 and 41 which will be described later from coming in contact with the supporting substrate 11 and the insulating film 12.

The movable unit 20 is disposed so as to cross the upper portion of the recessed portion 17 and both ends of a rectangular spindle 21 in a longitudinal direction are integrally linked to anchors 23a and 23b through a beam 22. The anchors 23a and 23b are opening edges of the recessed portion 17 and are supported by the supporting substrate 11 through the insulating film 12. Accordingly, the spindle 21 and the beam 22 are in a state of facing the recessed portion 17.

Herein, each direction of an x axis, a y axis, and a z axis in FIG. 1 and FIG. 2 will be described. In FIG. 1 and FIG. 2, the x axis direction is a longitudinal direction of the spindle 21. The y axis direction is a direction orthogonal to the x axis in the plane of the SOI substrate 14. The z axis direction is a direction orthogonal to the plane direction of the SOI substrate 14.

The beam 22 has a rectangular frame shape in which two parallel beams are linked to each other at both ends thereof and has a spring function of performing displacement in a direction orthogonal to a longitudinal direction of the two beams. Specifically, when acceleration including a component in the x axis direction is received, the beam 22 displaces the spindle 21 in the x axis direction and restores the spindle in the original state according to loss of the acceleration. Accordingly, the spindle 21 linked to the supporting substrate 11 through the beam 22 can be displaced in a displacement direction (x axis direction) of the beam 22 on the recessed portion 17 according to the application of the acceleration.

The movable unit 20 includes multiple movable electrodes 24 which are integrally formed to be protruded from both side surfaces of the spindle 21 in an opposite direction to each other, in a direction (y axis direction) orthogonal to the longitudinal direction of the spindle 21. In FIG. 1, four movable electrodes 24 are formed to be protruded on each of right and left sides of the spindle 21 and are in a state of facing the recessed portion 17. Each movable electrode 24 is integrally formed with the spindle 21 and beam 22 and can be displaced with the spindle 21 in the x axis direction by performing the displacement of the beam 22.

The first and second fixed units 30 and 40 are supported by the supporting substrate 11 through the insulating film 12 at a portion other than the portion of the opening edge of the recessed portion 17 by which the anchors 23a and 23b are supported. That is, the first and second fixed units 30 and 40 are disposed so as to interpose the movable unit 20. In FIG. 1, the first fixed unit 30 is disposed on the left side of the paper with respect to the movable unit 20 and the second fixed unit 40 is disposed on the right side of the paper with respect to the movable unit 20. The first and second fixed units 30 and 40 are electrically independent from each other.

The first and second fixed units 30 and 40 include multiple first and second fixed electrodes 31 and 41 which are disposed to oppose the side surfaces of the movable electrodes 24 in a parallel state at a predetermined detection interval, and first and second support units 32 and 42 which are supported by the supporting substrate 11 through the insulating film 12.

In FIG. 1, the four first fixed electrodes 31 and four second fixed electrodes 41 are formed and are arranged in a comb-tooth shape so as to engage with gaps of the teeth of the comb of the movable electrodes 24. The first and second fixed electrodes are in a state of facing the recessed portion 17 by being supported by each of the support units 32 and 42 in a cantilever state.

The first support unit 32 includes a first linking unit 32a including the first fixed electrode 31 and a first connection unit 32b for electrically connecting the first linking unit 32a with an external circuit. The second support unit 42 includes a second linking unit 42a including the second fixed electrode 41 and a second connection unit 42b for electrically connecting the second linking unit 42a with an external circuit.

In this embodiment, the first and second linking units 32a and 42a are formed in a planar rectangular shape in which long sides are parallel to the longitudinal direction (x axis direction) of the spindle 21 and includes the first and second fixed electrodes 31 and 41 at the end portions thereof on the movable unit 20 side. The end portions of the first and second linking units 32a and 42a on the movable unit 20 side are protruded from the recessed portion 17.

The first and second connection units 32b and 42b are respectively connected to the first and second linking units 32a and 42a and predetermined portions of the first and second connection units 32b and 42b are electrically connected to an external circuit through a bonding wire (not shown).

In the movable unit 20, the anchor 23b is electrically connected to an external circuit through the bonding wire (not shown). In the same manner as described above, a periphery 60 positioned around the movable unit 20 and the first and second fixed units 30 and 40 with the groove 16 interposed therebetween is also electrically connected to an external circuit through the bonding wire (not shown).

In the supporting substrate 11 and the insulating film 12, a first groove portion 18a is formed on a portion of the first linking unit 32a which opposes the end portion on the side opposite to the movable unit 20 side. In the same manner as described above, in the supporting substrate 11 and the insulating film 12, a second groove portion 18b is formed on a portion of the second linking unit 42a which opposes the end portion on the side opposite to the movable unit 20 side.

Specifically, the first and second groove portions 18a and 18b are provided to be extended in a direction (x axis direction) along a boundary of the first and second linking units 32a and 42a and the opening of the recessed portion 17.

Each end portion of the first and second linking units 32a and 42a on the side opposite to the movable unit 20 side are protruded from the first and second groove portions 18a and 18b. In detail, the first linking unit 32a is protruded from the first groove portion 18a so that a direction and a length of a boundary between the first linking unit 32a (first support unit 32) and the opening of the first groove portion 18a is equivalent to a direction and a length of a boundary between the first linking unit 32a (first support unit 32) and the opening of the recessed portion 17. In the same manner as described above, the second linking unit 42a is protruded from the second groove portion 18b so that a direction and a length of a boundary between the second linking unit 42a (second support unit 42) and the opening of the second groove portion 18b is equivalent to a direction and a length of a boundary between the second linking unit 42a (second support unit 42) and the opening of the recessed portion 17.

The equivalent state of the directions and the lengths of the boundary includes slight miscalculations occurred due to a manufacturing error or the like, in addition to a case where the directions and the lengths completely coincide with each other.

The first and second support units 32 and 42 formed of the first and second linking units 32a and 42a and the first and second connection units 32b and 42b are respectively set to have areas of the portions (areas of the portions opposing) bonded with the supporting substrate 11 through the insulating film 12 to be equivalent to each other. That is, the parasitic capacitance formed between the first support unit 32 and the supporting substrate 11 and the parasitic capacitance formed between the second support unit 42 and the supporting substrate 11 are set to be equivalent to each other.

The equivalent state of the areas includes a slight error generated due to a manufacturing error or the like, in addition to a case where the areas completely coincide with each other.

That is, in the capacitance type physical quantity sensor of this embodiment, first capacitance formed of detection capacitance formed between the movable electrode 24 and the first fixed electrode 31 and the parasitic capacitance formed between the first support unit 32 and the supporting substrate 11 is configured. In the same manner as described above, second capacitance formed of detection capacitance formed between the movable electrode 24 and the second fixed electrode 41 and the parasitic capacitance formed between the second support unit 42 and the supporting substrate 11 is configured. When acceleration is applied in the x axis direction, the entire movable unit 20 excluding the anchors 23a and 23b is integrally displaced in the x axis direction by the spring function of the beam 22 and the detection capacitance is changed depending on the displacement of the movable electrode 24.

Hereinabove, the configuration of the capacitance type physical quantity sensor of this embodiment has been described. In such a capacitance type physical quantity sensor, acceleration is detected based on a capacitance difference between the first capacitance and the second capacitance. At that time, the parasitic capacitance contained in the first capacitance and the parasitic capacitance contained in the second capacitance are equivalent to each other as described above. Therefore, each parasitic capacitance is canceled out when the capacitance difference between the first capacitance and the second capacitance is calculated, and generation of a detection error can be prevented.

Next, a manufacturing method of the capacitance type physical quantity sensor will be described with reference to FIGS. 3A to 3D.

Figure 3A:
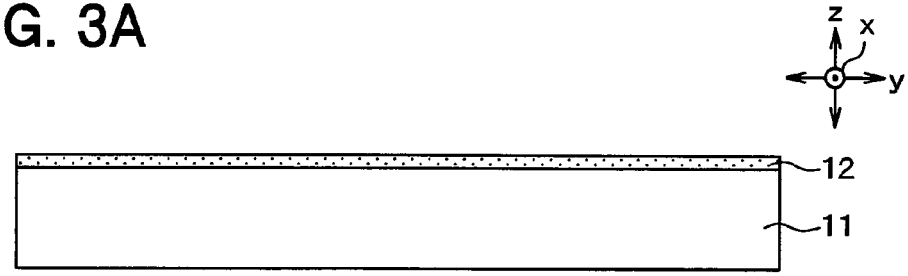
FIGS. 3A to 3D are cross-sectional views showing manufacturing steps of the capacitance type physical quantity sensor shown in FIG. 1.
Figure 3B:
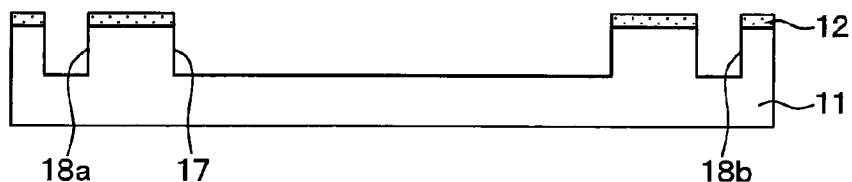

First, as shown in FIG. 3A, the insulating film 12 is formed on the supporting substrate 11. Then, as shown in FIG. 3B, a mask (not shown) such as a resist or an oxide film is formed on the insulating film 12 and the mask is patterned so that formation expectation areas of the recessed portion 17 and the first and second groove portions 18a and 18b are opened. Subsequently, the insulating film 12 and the supporting substrate 11 are etched by RIE or the like, for example, to form the recessed portion 17 and the first and second groove portions 18a and 18b.

Figure 3C:
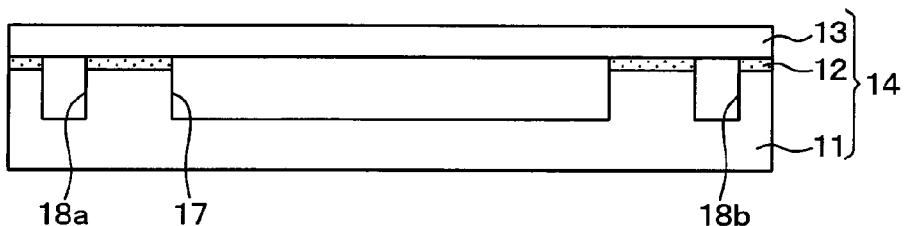

Next, as shown in FIG. 3C, the insulating film 12 and the semiconductor layer 13 are bonded to each other to form the SOI substrate 14. The method of bonding between the insulating film 12 and the semiconductor layer 13 is not particularly limited, but the bonding, for example, can be performed as follows.

First, the surface (bonding surface) of the insulating film 12 and the surface (bonding surface) of the semiconductor layer 13 are irradiated with $N_2$ plasma, $O_2$ plasma, or Ar ion beam and each surface (bonding surface) of the insulating film 12 and the semiconductor layer 13 is activated.

Then, alignment is performed with an infrared microscope using alignment marks which are suitably formed, and the insulating film 12 and the semiconductor layer 13 are bonded to each other by so-called direct bonding at a low temperature of a room temperature to 550° C.

The direct bonding is described as an example herein, but the insulating film 12 and the semiconductor layer 13 may be bonded by bonding techniques of anodic bonding or intermediate layer bonding. After the bonding, a process for improving bonding quality such as high temperature annealing may be performed. In addition, after the bonding, the semiconductor layer 13 may be processed to have a desired thickness by polishing and grinding.

Figure 3D:
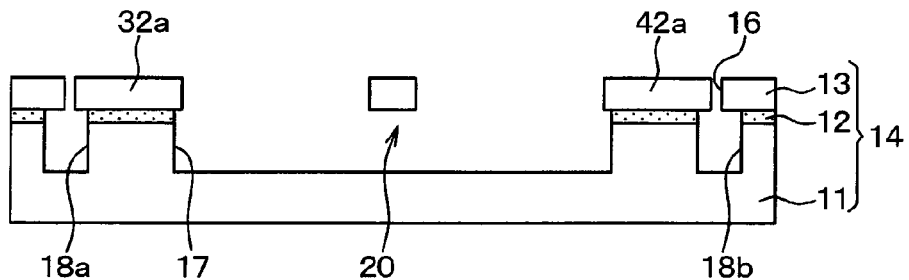

After that, as shown in FIG. 3D, a mask (not shown) such as a resist or an oxide film is formed on the semiconductor layer 13 and the mask is patterned so that formation expectation areas of the groove 16 are opened. Subsequently, the semiconductor layer 13 is etched by RIE or the like, for example, to form the groove 16. Accordingly, the movable unit 20 and the first and second fixed units 30 and 40 are formed and the capacitance type physical quantity sensor is produced.

When forming the first fixed unit 30, the first fixed unit 30 is formed so that the end portion of the first linking unit 32a on the movable unit 20 side is protruded from the recessed portion 17 and the end portion thereof on the side opposite to the movable unit 20 side is protruded from the first groove portion 18a. In the same manner as described above, when forming the second fixed unit 40, the second fixed unit 40 is formed so that the end portion of the second linking unit 42a on the movable unit 20 side is protruded from the recessed portion 17 and the end portion thereof on the side opposite to the movable unit 20 side is protruded from the second groove portion 18b.

At that time, several μm position shift may occur when patterning the mask, for example, and the positions of the movable unit 20 and the first and second fixed units 30 and 40 may be generally shifted to the first fixed unit 30 side (y axis direction). In this case, as shown in FIG. 4B, a length $L_1$ of the portion of the first linking unit 32a protruded from the recessed portion 17 is decreased and a length $L_2$ of the portion thereof protruded from the first groove portion 18a is increased.

Figure 4A:
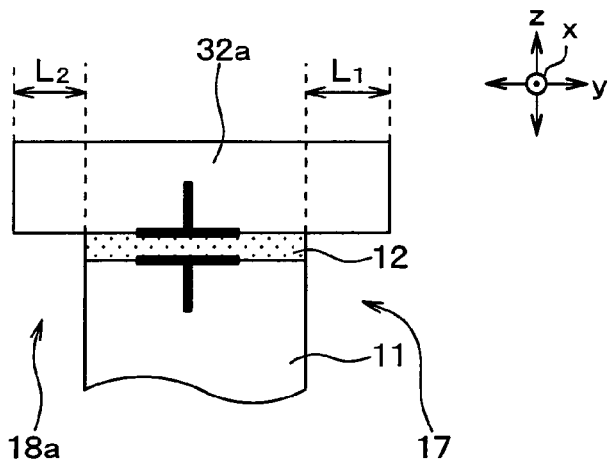
FIG. 4A is a cross-sectional view of a periphery of a first support unit when position shift has not occur in the step of FIG. 3D
Figure 4B:
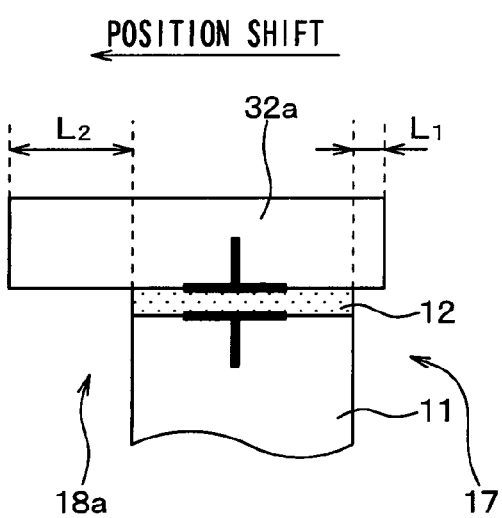
FIG. 4B is a cross-sectional view of a periphery of a first support unit when position shift has occurred in the step of FIG. 3D.

However, the sum of the lengths of the portions of the first linking unit 32a protruded from the recessed portion 17 and the first groove portion 18a is equivalent in a case where the position shift has not occurred (FIG. 4A) and a case where the position shift has occurred (FIG. 4B). That is, the area of the portion of the first linking unit 32a which is bonded with the supporting substrate 11 through the insulating film 12 (area of the portion opposing the supporting substrate 11) is not changed and the parasitic capacitance formed between the first linking unit 32a and the supporting substrate 11 is not changed either. In the same manner as described above, although not particularly shown, even when the position shift has occurred, the sum of the lengths of the portions of the second linking unit 42a protruded from the recessed portion 17 and the second groove portion 18b is not changed and the parasitic capacitance formed between the second linking unit 42a and the supporting substrate 11 is not changed either. That is, the lengths (widths) of the first and second groove portions 18a and 18b in the y axis direction are provided to be greater than the amount of the position shift which may occur in the manufacturing process, in advance, and accordingly, the change in the parasitic capacitance can be prevented, even when the position shift has occurred, as described above.

Therefore, by manufacturing the capacitance type physical quantity sensor as described above, a capacitance type physical quantity sensor in which the parasitic capacitance is not changed can be provided, even when the position shift has occurred.

As described above, in the capacitance type physical quantity sensor of this embodiment, the first and second groove portions 18a and 18b are formed and a part of each of the first and second support units 32 and 42 is protruded from the recessed portion 17 and the first and second groove portions 18a and 18b. The areas of the portions of the first and second support units (areas of the portions opposing) bonded with the supporting substrate 11 through the insulating film 12 are set to be equivalent to each other. Accordingly, the parasitic capacitances formed between the first and second support units 32 and 42 and the supporting substrate 11 are equivalent to each other and generation of a detection error is prevented.

When manufacturing the capacitance type physical quantity sensor, the first groove portion 18a is formed and the first fixed unit 30 is formed so that the end portion of the first linking unit 32 on the movable unit 20 side is protruded from the recessed portion 17 and the end portion thereof on the side opposite to the movable unit 20 side is protruded from the first groove portion 18a. The second groove portion 18b is formed and the second fixed unit 40 is formed so that the end portion of the second linking unit 42a on the movable unit 20 side is protruded from the recessed portion 17 and the end portion thereof on the side opposite to the movable unit 20 side is protruded from the second groove portion 18b.

Accordingly, when forming the movable unit 20 and the first and second fixed units 30 and 40, the areas of the portions of the first and second support units 32 and 42 which are bonded with the supporting substrate 11 through the insulating film 12 (areas of the portions opposing the supporting substrate 11) are not changed, even when the positions of the movable unit 20 and the first and second fixed units 30 and 40 are generally shifted in the y axis direction. That is, the parasitic capacitance formed between the first and second support units 32 and 42 and the supporting substrate 11 is not changed. Therefore, a capacitance type physical quantity sensor in which the parasitic capacitance is not changed and the generation of the detection error is prevented can be produced, even when the position shift has occurred.

In the above description, the position shift in the y axis direction has been described as an example, but according to this embodiment, a capacitance type physical quantity sensor in which the parasitic capacitance is not changed and the generation of the detection error is prevented even when the position shift in the x axis direction and a rotation direction around the z axis direction which may occur in the manufacturing process has occurred can be produced.

Second Embodiment

Second Embodiment of the present disclosure will be described. In this embodiment, a cap is bonded to the semiconductor layer 13 unlike First Embodiment, and other configurations are the same as the configurations of First Embodiment, and therefore the description thereof will be omitted.

Figure 5:
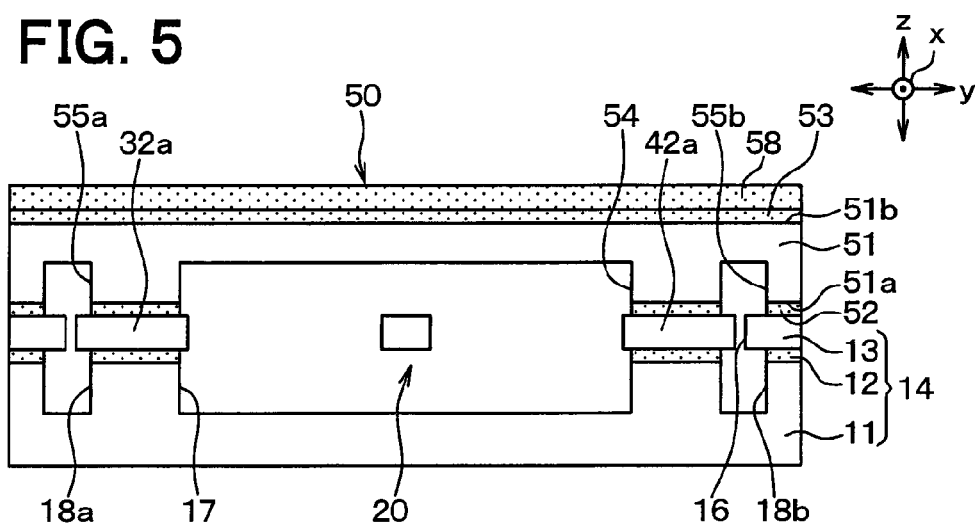
FIG. 5 is a cross-sectional view of a capacitance type physical quantity sensor of Second Embodiment of the present disclosure.
Figure 6:
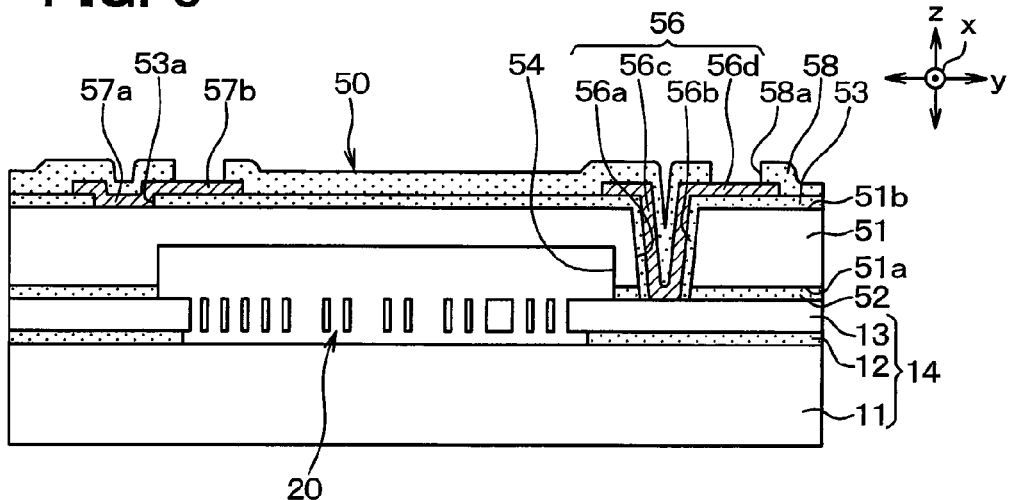
FIG. 6 is a cross-sectional view of the capacitance type physical quantity sensor showing a section different from FIG. 5.

In this embodiment, as shown in FIG. 5 and FIG. 6, a cap 50 is provided on the semiconductor layer 13 so as to airtightly seal the sensing unit 15, in order to prevent attachment of water or foreign materials to the sensing unit 15. The SOI substrate 14 of FIG. 5 is shown as a cross-sectional view corresponding to line II-II of FIG. 1 and the cap 50 is shown as a cross-sectional view corresponding to line II-II. The SOT substrate 14 of FIG. 6 is shown as a cross-sectional view corresponding to line VI-VI of FIG. 1 and the cap 50 is shown as a cross-sectional view corresponding to line VI-VI.

The cap 50 is configured by forming an insulating film 52 on one surface 51a of the semiconductor substrate 51 and forming an insulating film 53 on the other surface 51b, and the insulating film 52 is bonded with the semiconductor layer 13. A recessed portion 54 is formed on a portion of the semiconductor substrate 51 and the insulating film 52 which opposes the movable electrode 24 and the first and second fixed electrodes 31 and 41. In the same manner as the recessed portion 17, a recessed portion 54 prevents the movable electrode 24 and the first and second fixed electrodes 31 and 41 from coming in contact with the semiconductor substrate 51 and the insulating film 52.

In this embodiment, the semiconductor layer 13 corresponds to the first substrate of the capacitance type physical quantity sensor and the supporting substrate 11 and the semiconductor substrate 51 correspond to the second substrate of the capacitance type physical quantity sensor. That is, in the capacitance type physical quantity sensor of this embodiment, the first substrate is disposed between the two second substrates.

In the semiconductor substrate 51 and the insulating film 52, a first groove portion 55a is formed on a portion of the first linking unit 32a which opposes the end portion on the side opposite to the movable unit 20 side, and a second groove portion 55b is formed on a portion of the second linking unit 42a which opposes the end portion on the side opposite to the movable unit 20 side.

Specifically, the first and second groove portions 55a and 55b are provided to be extended in a direction (x axis direction) along a boundary between the first and second linking units 32a and 42a and an opening of the recessed portion 54.

The end portions of the first and second linking units 32a and 42a on the side opposite to the movable unit 20 side are protruded from the first and second groove portions 55a and 55b. In detail, the first linking unit 32a is protruded from the first groove portion 55a so that a direction and a length of a boundary between the first linking unit 32a (first support unit 32) and the opening of the first groove portion 55a is equivalent to a direction and a length of a boundary between the first linking unit 32a (first support unit 32) and the opening of the recessed portion 54. In the same manner as described above, the second linking unit 42a is protruded from the second groove portion 55b so that a direction and a length of a boundary between the second linking unit 42a (second support unit 42) and the opening of the second groove portion 55b is equivalent to a direction and a length of a boundary between the second linking unit 42a (second support unit 42) and the opening of the recessed portion 54.

The first and second linking units 32a and 42a are respectively set to have areas of the portions (areas of the portions opposing) bonded with the semiconductor substrate 51 through the insulating film 52 to be equivalent to each other. That is, the parasitic capacitance formed between the first linking unit 32a and the semiconductor substrate 51 and the parasitic capacitance formed between the second linking unit 42a and the semiconductor substrate 51 are set to be equivalent to each other.

Four penetration electrode units 56 which penetrate the cap 50 in a stacking direction of the SOI substrate 14 and the cap 50 are formed on the cap 50. Specifically, each penetration electrode unit 56 is configured with a hole 56a which penetrates the insulating film 53, the semiconductor substrate 51, and the insulating film 52, an insulating film 56 which is formed on a wall surface of the hole 56a, and a penetration electrode 56c which is formed on the insulating film 56b, and a pad 56d.

One of the four penetration electrode units 56 is electrically connected to the anchor 23b. Two of the four penetration electrode units 56 are respectively electrically connected to the first and second connection unit 32b and 42b. In addition, one of the four penetration electrode units 56 is electrically connected to the periphery 60.

In FIG. 6, the hole 56a is formed in a conical shape, but the hole 56a may be formed in a cylindrical shape or in a polygonal cylindrical shape. In addition, an insulating material such as TEOS is used as the insulating film 56a, for example, and Al or the like is used as the penetration electrode 56c and the pad 56d, for example.

In this embodiment, an electrode 57a and a pad 57b are formed so as to realize electrical connection between the semiconductor substrate 51 and an external circuit. In detail, the electrode 57a is formed so as to be connected with the semiconductor substrate 51 through a contact hole 53a formed on the simulating film 53. The pad 57b is formed on the insulating film 53.

A protection film 58 is formed on the insulating film 53, the penetration electrode 56c, the pad 56d, the electrode 57a, and the pad 57b, and a contact hole 58a for exposing the pads 56d and 57b is formed on the protection film 58. Accordingly, the electric connection between the pads 56d and 57b and an external circuit is realized.

Hereinabove, the configuration of the capacitance type physical quantity sensor of this embodiment has been described. Next, a manufacturing method of the capacitance type physical quantity sensor will be described.

Figure 7A:
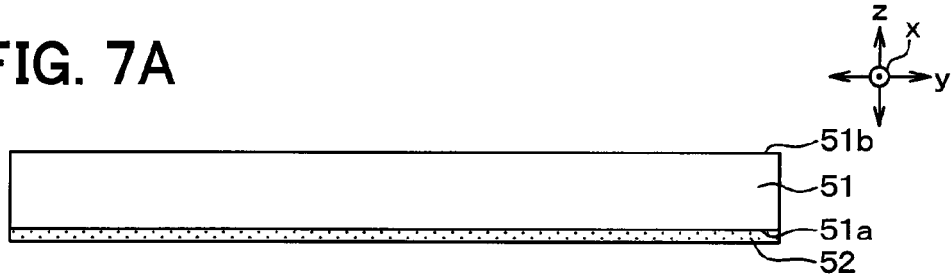
FIGS. 7A to 7C are cross-sectional views showing manufacturing steps of the capacitance type physical quantity sensor shown in FIG. 5.
Figure 7B:
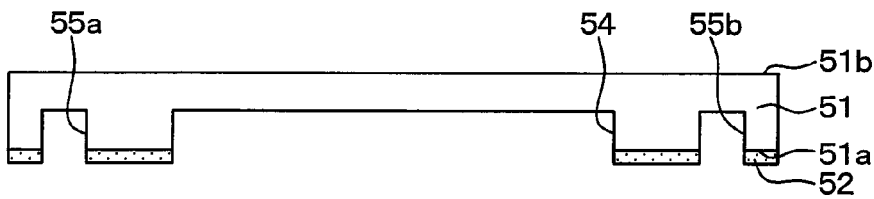

First, as shown in FIG. 7A, the insulating film 52 is formed on one surface 51a of the semiconductor substrate 51. As shown in FIG. 7B, a mask (not shown) such as a resist or an oxide film is formed on the insulating film 52 and the mask is patterned so that formation expectation areas of the recessed portion 54 and the first and second groove portions 55a and 55b are opened. Subsequently, the insulating film 52 and the semiconductor substrate 51 are etched by RIE or the like, for example, to form the recessed portion 54 and the first and second groove portions 55a and 55b.

Figure 7C:
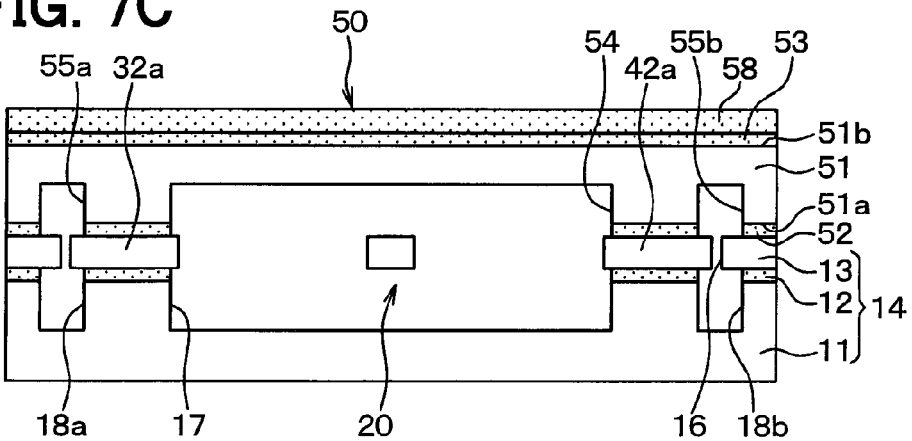

The components obtained by performing the steps of FIGS. 3A to 3D are prepared and the semiconductor layer 13 and the insulating film 52 are bonded to each other as shown in FIG. 7C.

Specifically, the semiconductor layer 13 and the insulating film 52 are bonded to each other so that the end portion of the first linking unit 32a on the movable unit 20 side is protruded from the recessed portion 54 and the end portion thereof on the side opposite to the movable unit 20 side is protruded from the first groove portion 55a. In addition, the semiconductor layer 13 and the insulating film 52 are bonded to each other so that the end portion of the second linking unit 42a on the movable unit 20 side is protruded from the recessed portion 54 and the end portion thereof on the side opposite to the movable unit 20 side is protruded from the second groove portion 55b.

At that time, the position shift due to alignment shift or the like may occur and the positions of the movable unit 20 and the first and second fixed units 30 and 40 may be generally shifted in the y axis direction. However, in the same manner as described above, since the first and second groove portions 55a and 55b are formed, the sum of the lengths of the first linking unit 32a protrude from the recessed portion 54 and the first groove portion 55a is not changed and the parasitic capacitance formed between the first linking unit 32a and the supporting substrate 11 is not changed. In the same manner as described above, the sum of the lengths of the portions of the second linking unit 42a protruded from the recessed portion 17 and the second groove portion 18b is not changed and the parasitic capacitance formed between the second linking unit 42a and the supporting substrate 11 is not changed either.

Subsequently, although not particularly shown, the positions of the semiconductor substrate 51 and the insulating film 52 corresponding to the anchor 23b, the first and second connection units 32b and 42b, and the periphery 60 are etched and removed to form four holes 56a. After that, the insulating film 56b such as TEOS is formed on the wall surface of each hole 56a. At that time, the insulating film 53 is configured by an insulating film formed on the other surface 51b of the semiconductor substrate 51. Subsequently, the insulating film 56b formed on the bottom portion of each hole 56a is removed and the semiconductor layer 13 is exposed. A part of the insulating film 53 is removed at the same time and the contact hole 53a which partially exposes the other surface 51b of the semiconductor substrate 51 is formed.

Next, metal such as Al or Al—Si is formed on the hole 56a by a sputtering method or vapor deposition method and the penetration electrode 56c is formed, and each penetration electrode 56c and the anchor 23b, the first and second connection units 32b and 42b and the periphery 60 are electrically connected to each other. At that time, the electrode 57a is also formed at the same time. The metal on the insulating film 53 is patterned and the pads 56d and 57b are formed.

After that, the protection film 58 is formed by a CVD method or the like, the contact hole 58a is formed by etching, and the capacitance type physical quantity sensor of this embodiment is produced.

As described above, in this embodiment, the cap 50 is provided and attachment of water or foreign materials to the sensing unit 15 can be prevented. Since the first and second groove portions 55a and 55b are formed on the semiconductor substrate 51, if position shift occurs due to alignment shift when bonding the semiconductor layer 13 and the insulating film 52, the parasitic capacitance formed between the first support unit 32 and the semiconductor substrate 51 and the parasitic capacitance formed between the second support unit 42 and the semiconductor substrate 51 are not changed. Accordingly, the detection error can be prevented.

Third Embodiment

Third Embodiment of the present disclosure will be described. In this embodiment, first and second recesses are formed on the supporting substrate 11 and the insulating film 12 unlike First Embodiment, and other configurations are the same as the configurations of First Embodiment, and therefore the description thereof will be omitted.

Figure 8:
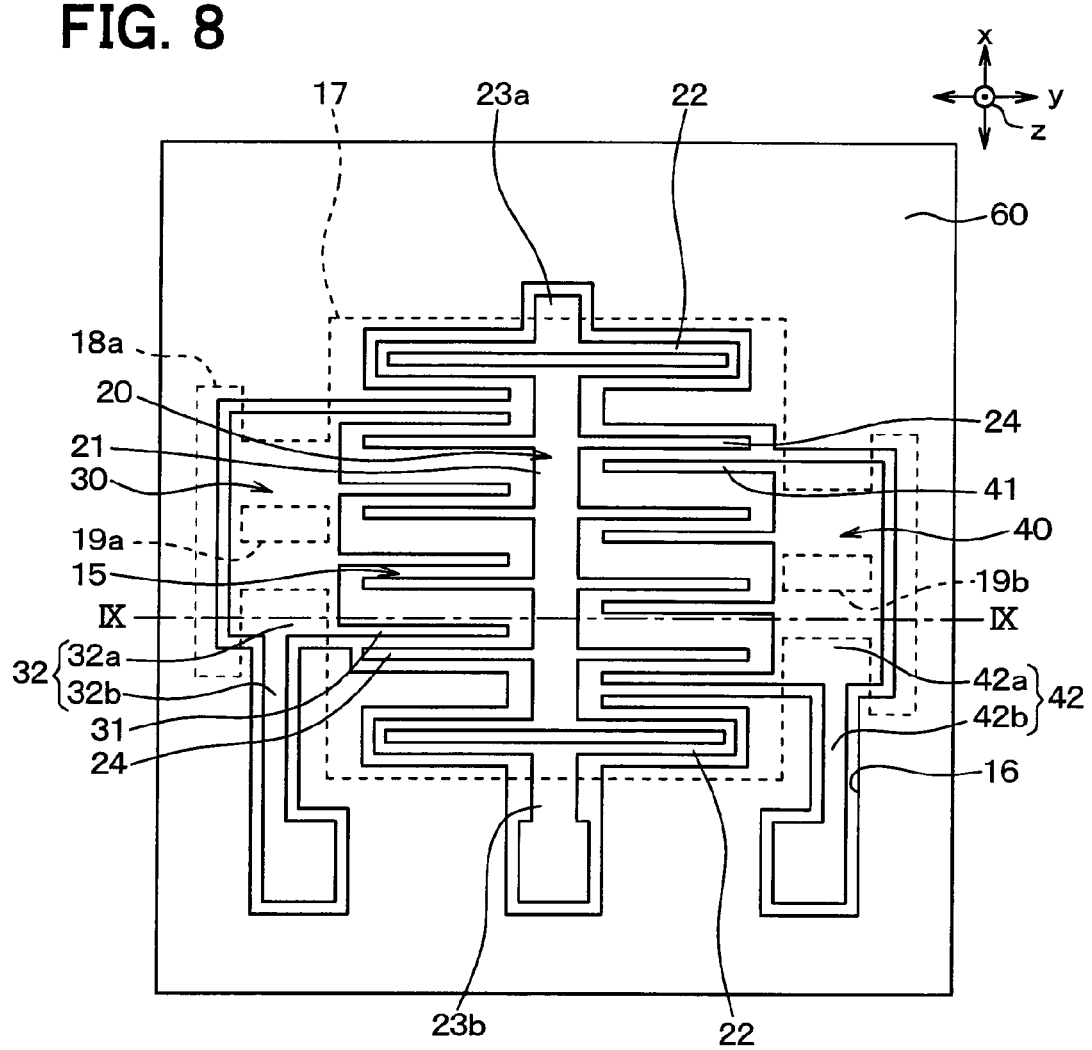
FIG. 8 is a plan view of a capacitance type physical quantity sensor of Third Embodiment of the present disclosure.
Figure 9:
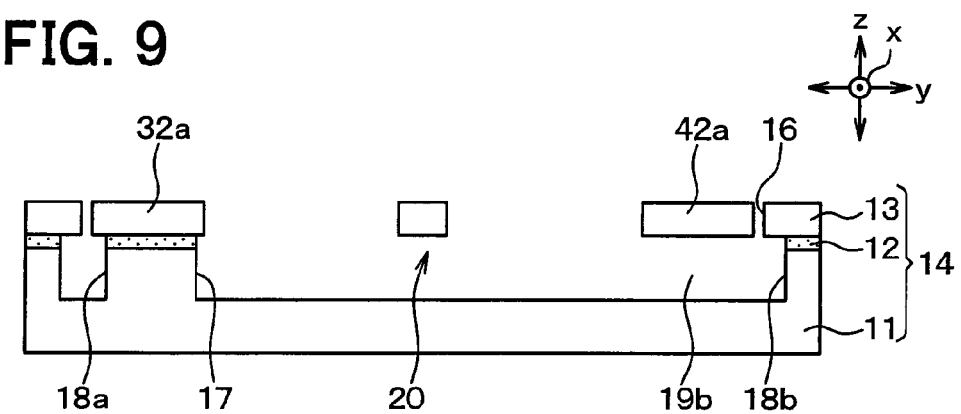
FIG. 9 is a cross-sectional view of the capacitance type physical quantity sensor taken along line IX-IX of FIG. 8.

In this embodiment, as shown in FIG. 8 and FIG. 9, two first recesses 19a are formed on portions of the supporting substrate 11 and the insulating film 12 opposing the first linking unit 32a. Two second recesses 19b having the same size as that of the first recess 19a are formed on portions of the supporting substrate 11 and the insulating film 12 opposing the second linking unit 42a.

In this embodiment, the first recesses 19a are formed so as to communicate with the recessed portion 17 and the first groove portion 18a and the second recesses 19b are formed so as to communicate with the recessed portion 17 and the second groove portion 18b.

In such a capacitance type physical quantity sensor, the magnitude of the parasitic capacitance formed between the first linking unit 32a and the supporting substrate 11 and the parasitic capacitance formed between the second linking unit 42a and the supporting substrate 11 can be decreased. Accordingly, an initial SN ratio (signal noise ratio) can be increased.

Herein, an example where two of the first recesses 19a and the second recesses 19b are formed has been described, but only one of the first recesses 19a and the second recesses 19b may be formed or more plural recesses may be formed.

Fourth Embodiment

Fourth Embodiment of the present disclosure will be described. In this embodiment, first and second holes are formed on the first and second linking units 32a and 42a unlike First Embodiment, and other configurations are the same as the configurations of First Embodiment, and therefore the description thereof will be omitted.

Figure 10:
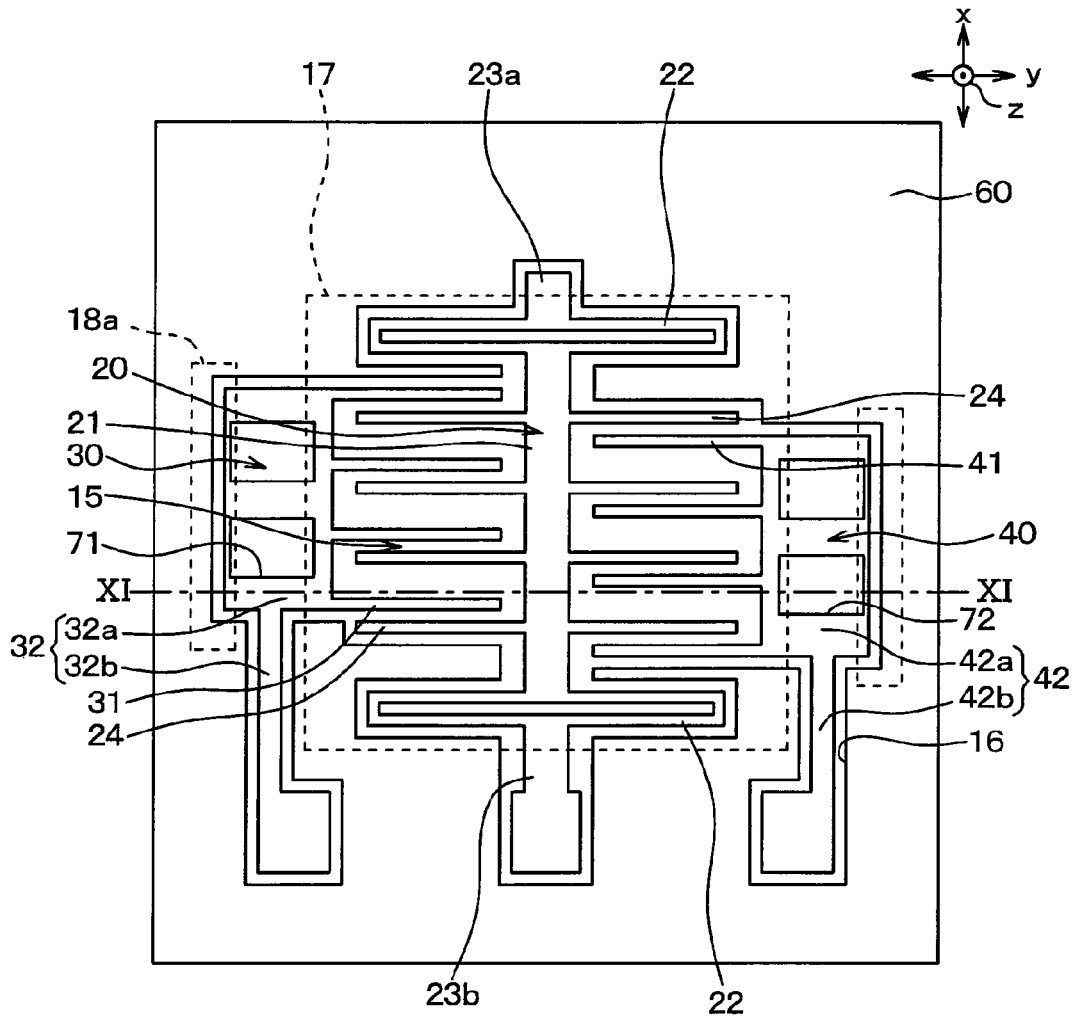
FIG. 10 is a plan view of a capacitance type physical quantity sensor of Fourth Embodiment of the present disclosure.
Figure 11:
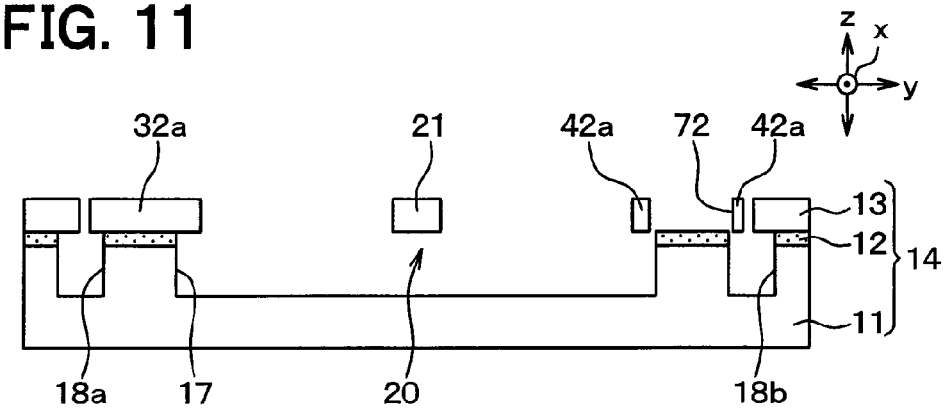
FIG. 11 is a cross-sectional view of the capacitance type physical quantity sensor taken along line XI-XI of FIG. 10.

In this embodiment, as shown in FIG. 10 and FIG. 11, two first holes 71 and second holes 72 having the same size are respectively formed on the first and second linking units 32a and 42a. Specifically, the two first holes 71 are formed on a portion positioned on the recessed portion 17 to a portion positioned on the first groove portion 18a among the first linking unit 32a. The two second holes 72 are formed on a portion positioned on the recessed portion 17 to a portion positioned on the second groove portion 18b among the second linking unit 42a.

In such a capacitance type physical quantity sensor, the magnitude of the parasitic capacitance can be decreased, in the same manner as in Third Embodiment. Accordingly, an initial signal noise ratio (SN ratio) can be increased.

The physical quantity sensor is produced by forming the first and second holes 71 and 72 from the portion positioned on the recessed portion 17 to the portion positioned on the first and second groove portions 18a and 18b, when forming the groove 16.

Herein, an example where the two first holes 71 and second holes 72 are formed has been described, but only one first hole 71 and the second hole 72 may be provided or more plural holes may be formed.

Fifth Embodiment

Fifth Embodiment of the present disclosure will be described. In this embodiment, the shapes of the recessed portion 17 and the first and second groove portions 18a and 18b are changed unlike Second Embodiment, and other configurations are the same as the configurations of First Embodiment, and therefore the description thereof will be omitted.

Figure 12:
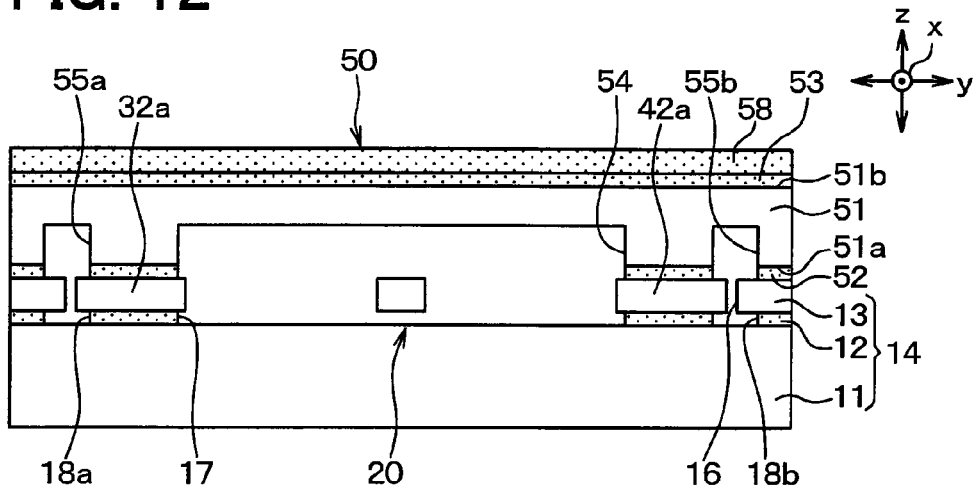
FIG. 12 is a cross-sectional view of a capacitance type physical quantity sensor of Fifth Embodiment of the present disclosure.

As shown in FIG. 12, in this embodiment, the recessed portion 17 and the first and second groove portions 18a and 18b are formed only on the insulating film 12. In such a capacitance type physical quantity sensor, since the first and second groove portions 18a, 18b, 55a, and 55b are formed, the same effects as those of Second Embodiment can be obtained.

Sixth Embodiment

Sixth Embodiment of the present disclosure will be described. In this embodiment, the shapes of the recessed portion 54 and the first and second groove portions 55a and 55b are changed unlike Second Embodiment, and other configurations are the same as the configurations of First Embodiment, and therefore the description thereof will be omitted.

Figure 13:
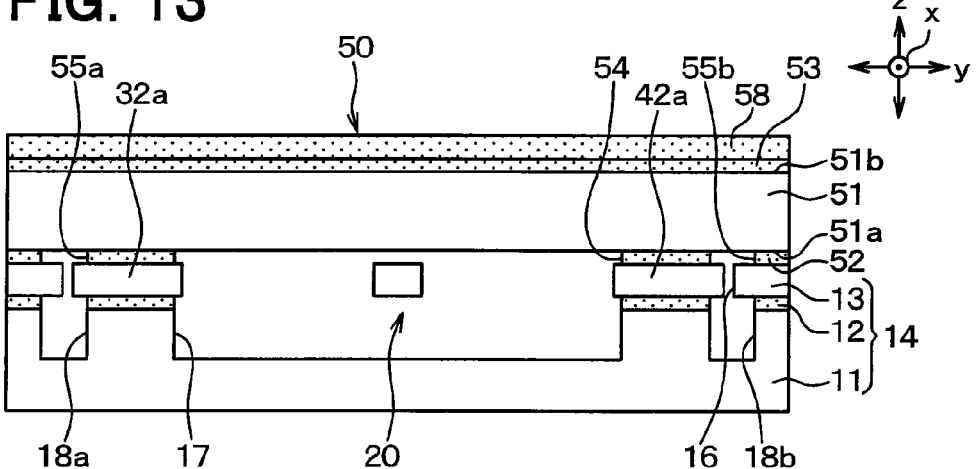
FIG. 13 is a cross-sectional view of a capacitance type physical quantity sensor of Sixth Embodiment of the present disclosure.
Figure 14:
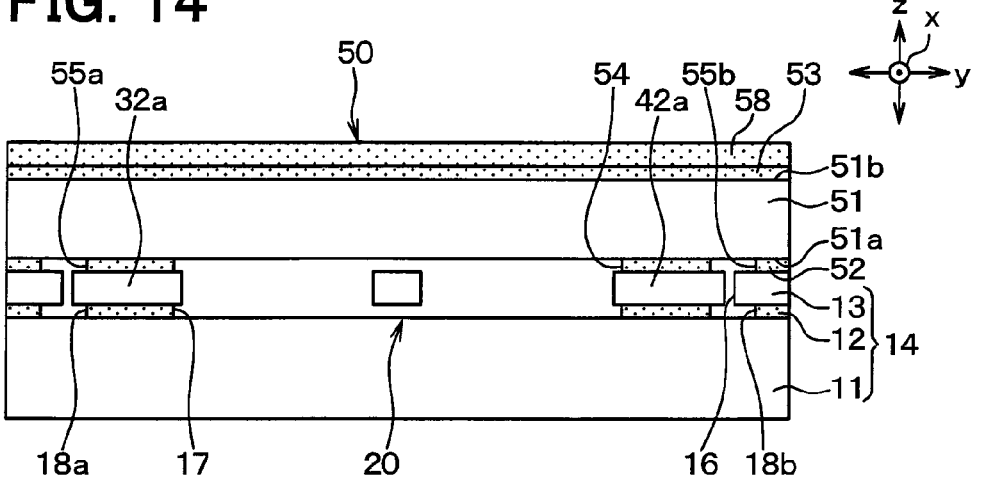
FIG. 14 is a cross-sectional view of a capacitance type physical quantity sensor of Seventh Embodiment of the present disclosure.

In this embodiment, as shown in FIG. 13, the recessed portion 54 and the first and second groove portions 55a and 55b are formed only in the insulating film 52. In such a capacitance type physical quantity sensor, since the first and second groove portions 18a, 18b, 55a, and 55b are formed, the same effects as those of Second Embodiment can be obtained.

Seventh Embodiment

Seventh Embodiment of the present disclosure will be described. In this embodiment, the shapes of the recessed portions 17 and 54 and the first and second groove portions 18a, 18b, 55a, and 55b are changed unlike Second Embodiment, and other configurations are the same as the configurations of First Embodiment, and therefore the description thereof will be omitted.

As shown in FIG. 12, in this embodiment, the recessed portion 17 and the first and second groove portions 18a and 18b are formed only on the insulating film 12. The recessed portion 54 and the first and second groove portions 55a and 55b are formed only on the insulating film 52.

In such a capacitance type physical quantity sensor, since the first and second groove portions 18a, 18b, 55a, and 55b are formed, the same effects as those of Second Embodiment can be obtained.

Eighth Embodiment

Figure 15:
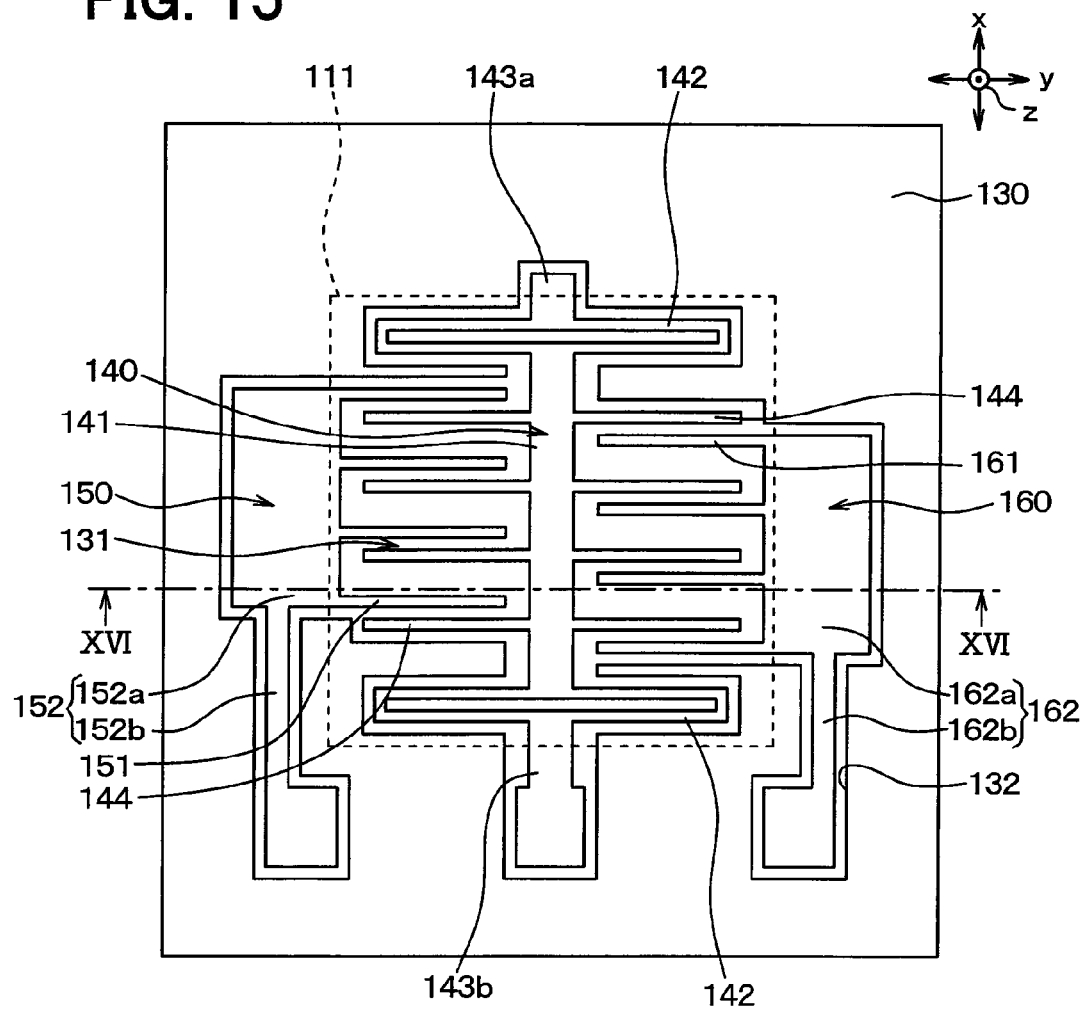
FIG. 15 is a plan view of an acceleration sensor of Eighth Embodiment of the present disclosure.
Figure 16:
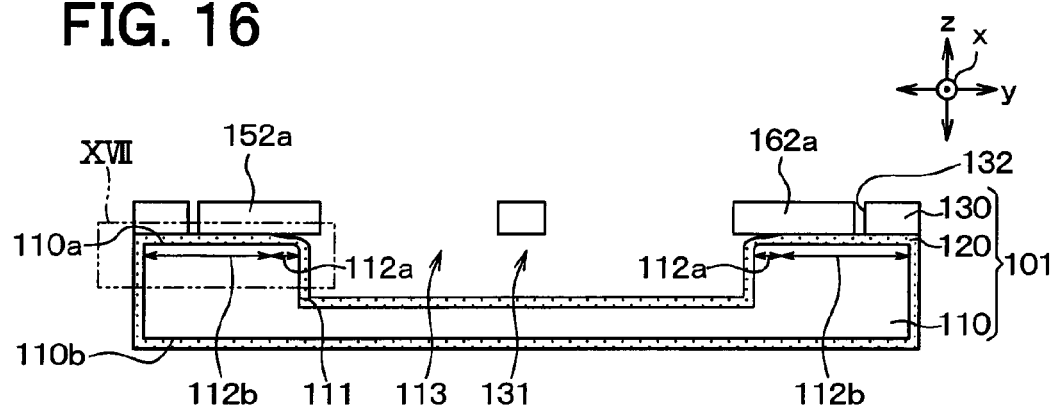
FIG. 16 is a cross-sectional view of the acceleration sensor taken along line XVI-XVI of FIG. 15.

Eighth Embodiment of the present disclosure will be described. As shown in FIG. 15 and FIG. 16, an acceleration sensor of this embodiment is configured using a SOI substrate 101 including a supporting substrate 110 which includes one surface 110a and the other surface 110b, a thermal oxide film 120 which is formed on the supporting substrate 110, and a semiconductor layer 130 which is disposed on a side opposite to the supporting substrate 110 with the thermal oxide film 120 interposed therebetween.

The supporting substrate 110 and the semiconductor layer 130 are configured with a silicon substrate. In this embodiment, the supporting substrate 110 corresponds to a first substrate of the SOI substrate and the semiconductor layer 130 corresponds to a second substrate of the SOI substrate.

A sensing unit 131 subjected to a well-known micromachine processing is formed on the SOI substrate 101. Specifically, a movable unit 140 and first and second fixed units 150 and 160 having a beam structure having a comb-tooth shape by forming a groove 132 are formed on the semiconductor layer 130 and a sensing unit 131 which outputs a sensor signal according to acceleration by this beam structure is formed.

A recessed portion 111 is formed on a portion of the supporting substrate 110 corresponding to a formation area of the beam structure. The thermal oxide film 120 is formed on the entire surface of the supporting substrate 110 including the wall surface of the recessed portion 111. That is, the thermal oxide film 120 is also formed on the other surface 110b and the side surface of the supporting substrate 110.

Figure 17:
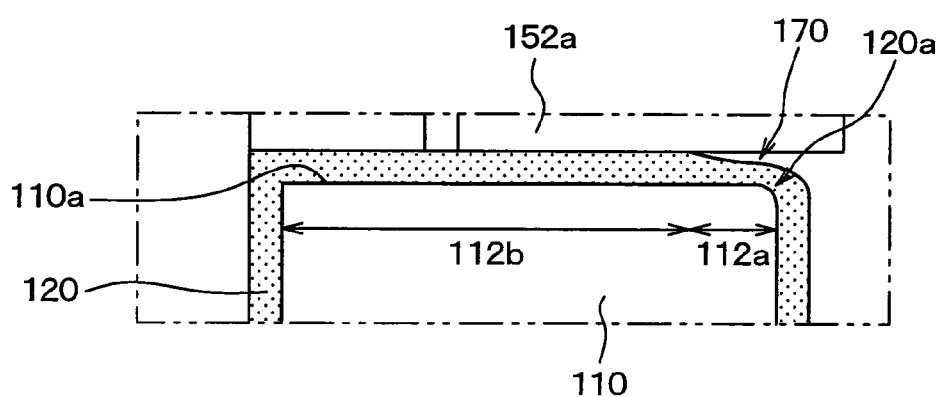
FIG. 17 is an enlarged view of an area XVII of FIG. 16.

As shown in FIG. 17, when a periphery portion of the opening of the recessed portion 111 among one surface 110a of the supporting substrate 110 is set as a boundary area 112a and an area surrounding the boundary area 112a is set as a periphery area 112b, a thickness of the portion of the thermal oxide film 120 formed in the boundary area 112a is equal to or smaller than a thickness of the portion thereof formed in the periphery area 112b. In this embodiment, the thickness of the portion of the thermal oxide film 120 formed in the boundary area 112a is set to be thinner than the thickness of the portion thereof formed in the periphery area 112b. The area of the boundary area 112a is decreased to be smaller than the area of the peripheral area 112b.

The semiconductor layer 130 is bonded to a portion of the thermal oxide film 120 which is formed in the peripheral area 112b. Accordingly, an relaxation space 170 is configured between a boundary portion 120a linking a portion of the thermal oxide film 120 formed along one surface 110a of the supporting substrate 110 and a portion thereof formed along the wall surface of the recessed portion 111, and the semiconductor layer 130. That is, the relaxation space 170 is configured between the portion of the thermal oxide film 120 formed in the boundary area 112a and the semiconductor layer 130.

As shown in FIG. 15 and FIG. 16, the movable unit 140 formed on the semiconductor layer 130 is disposed so as to cross the upper portion of the recessed portion 111 and both ends of a rectangular spindle 141 in a longitudinal direction are integrally linked to anchors 143a and 143b through a beam 142. The anchors 143a and 143b are opening edges of the recessed portion 111 and are supported by the supporting substrate 110 through the thermal oxide film 120. Accordingly, the spindle 141 and the beam 142 are in a state facing a space 113 surrounded by the thermal oxide film 120 formed on the wall surface of the recessed portion 111 (hereinafter, simply referred to as a space 113).

Herein, each direction of the x axis direction, the y axis direction, and the z axis direction in FIG. 15 and FIG. 16 will be described. In FIG. 15 and FIG. 16, the x axis direction is a longitudinal direction of the spindle 141. The y axis direction is a direction orthogonal to the x axis in the plane of the SOI substrate 101. The z axis direction is a direction orthogonal to the plane direction of the SOI substrate 101.

The beam 142 has a rectangular frame shape in which two parallel beams are linked to each other at both ends thereof and has a spring function of performing displacement in a direction orthogonal to a longitudinal direction of the two beams. Specifically, when acceleration including a component in the x axis direction is received, the beam 142 displaces the spindle 141 in the x axis direction and restores the spindle in the original state according to loss of the acceleration. Accordingly, the spindle 141 linked to the supporting substrate 110 through the beam 142 can be displaced in a displacement direction (x axis direction) of the beams 142 on the recessed portion 111 according to the application of the acceleration.

The movable unit 140 includes multiple movable electrodes 144 which are integrally formed to be protruded from both side surfaces of the spindle 141 in an opposite direction to each other, in a direction (y axis direction) orthogonal to the longitudinal direction of the spindle 141. In FIG. 15, four movable electrodes 144 are formed to be protruded on each of right and left sides of the spindle 141 and are in a state of facing the space 113. Each movable electrode 144 is integrally formed with the spindle 141 and beam 142 and can be displaced with the spindle 141 in the x axis direction by performing the displacement of the beam 142.

The first and second fixed units 150 and 160 have the same shape, and are supported by the supporting substrate 110 via the thermal oxide film 120, at a portion other than the portion of the opening edge of the recessed portion 111 where the anchors 143a and 143b is supported. That is, the first and second fixed units 150 and 160 are disposed so as to interpose the movable unit 140. In FIG. 15, the first fixed unit 150 is disposed on the left of the paper with respect to the movable unit 140 and the second fixed unit 160 is disposed on the right of the paper with respect to the movable unit 140. The first and second fixed units 150 and 160 are electrically independent from each other.

The first and second fixed units 150 and 160 include multiple first and second fixed electrodes 151 and 161 which are disposed to oppose the side surfaces of the movable electrodes 144 in a parallel state at a predetermined detection interval, and first and second support units 152 and 162 which are supported by the supporting substrate 110 through the thermal oxide film 120.

In FIG. 15, the four first fixed electrodes 151 and four second fixed electrodes 161 are formed and are arranged in a comb-tooth shape so as to engage with gaps of the teeth of the comb of the movable electrodes 144. The first and second fixed electrodes are in a state of facing the space 113 by being supported by each of the support units 152 and 6 in a cantilever state.

The first support unit 152 includes a first linking unit 152a including the first fixed electrode 151 and a first connection unit 152b for electrically connecting the first linking unit 152a with an external circuit. In the same manner as described above, the second support unit 162 includes a second linking unit 162a including the second fixed electrode 161 and a second connection unit 162b for electrically connecting the second linking unit 162a with an external circuit.

In this embodiment, the first and second linking units 152a and 162a are formed in a planar rectangular shape in which long sides are parallel to the longitudinal direction (x axis direction) of the spindle 141 and includes the first and second fixed electrodes 151 and 161 at the end portions thereof on the movable unit 140 side. The end portions of the first and second linking units 152a and 162a on the movable unit 140 side are protruded from the space 113.

The first and second connection units 152b and 162b are respectively connected to the first and second linking units 152a and 162a and predetermined portions of the first and second connection units are electrically connected to an external circuit through a bonding wire (not shown). In the movable unit 140, the anchor 143b is electrically connected to an external circuit through the bonding wire (not shown).

Hereinabove, the configuration of the acceleration sensor of this embodiment has been described. In such an acceleration sensor, acceleration is detected based on a capacitance difference between first capacitance formed between the movable electrode 144 and the first fixed electrode 151 and second capacitance formed between the movable electrode 144 and the second fixed electrode 161.

Next, a manufacturing method of the acceleration sensor will be described with reference to FIGS. 18A to 18E.

Figure 18A:
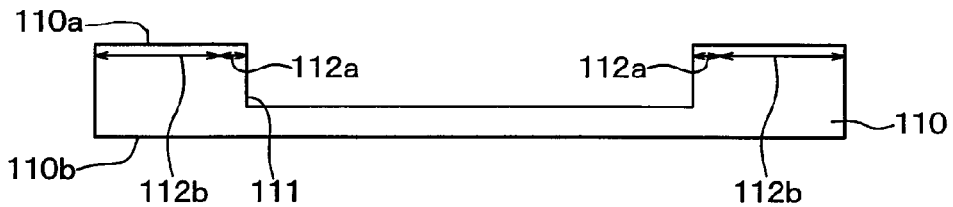
FIGS. 18A to 18E are cross-sectional views showing manufacturing steps of the acceleration sensor shown in FIG. 15.

First, as shown in FIG. 18A, the supporting substrate 110 including one surface 110a and the other surface 110b is prepared. A resist (not shown) or the like is formed on one surface 110a of the supporting substrate 110 and the recessed portion 111 is formed by dry etching or the like using the resist as a mask.

Figure 18B:
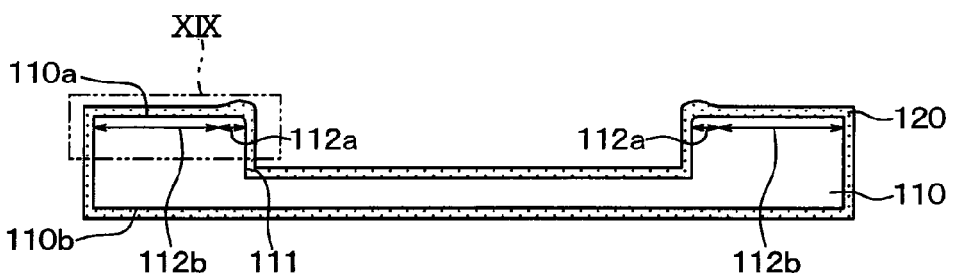
Figure 19:
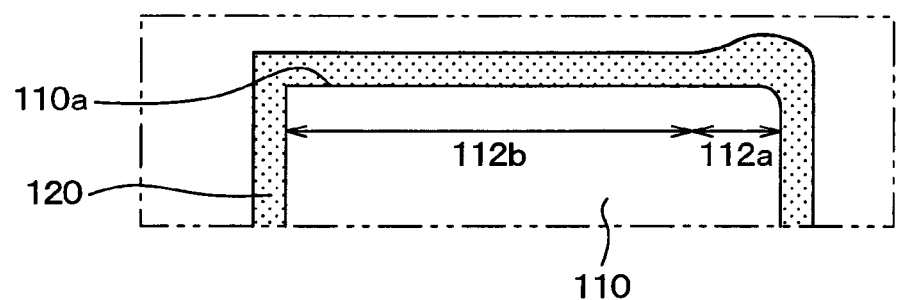
FIG. 19 is an enlarged view of an area XIX in FIG. 18B.

Then, as shown in FIG. 18B, the thermal oxide film 120 is formed on the entire surface of the supporting substrate 110 by performing thermal oxidation of the supporting substrate 110. At that time, as shown in FIG. 19, stress is concentrated on the boundary area 112a among the supporting substrate 110, and accordingly, the thermal oxide film 120 which is thicker than the periphery area 112b is formed. That is, in the boundary area 112a, the thermal oxide film 120 is formed to be swollen. That is, the boundary area 112a of the supporting substrate 110 can be said as a portion where the thermal oxide film 120 is formed to be swollen.

Figure 18C:
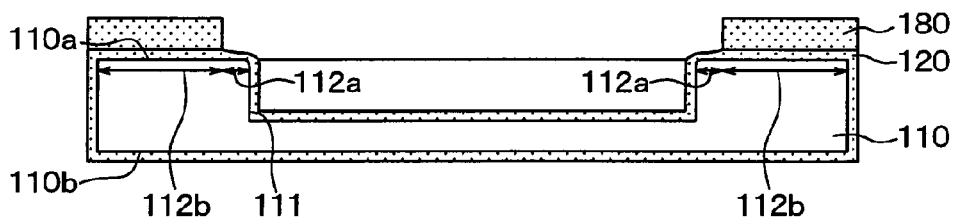

Subsequently, as shown in FIG. 18C, a resist 180 is formed on one surface 110a side of the supporting substrate 110 so that a portion of the thermal oxide film 120 which is formed in the boundary area 112a is exposed. A thermal oxidation film adjustment step of decreasing a film thickness of the portion of the thermal oxide film 120 formed in the boundary area 112a to be smaller than the thickness of the portion thereof formed in the periphery area 112b is performed, by performing dry etching or wet etching using the resist 180 as a mask. In this step, the thickness of the portion of the thermal oxide film 120 formed in the boundary area 112a is decreased to be smaller than the thickness the portion thereof formed in the periphery area 112b, so that the supporting substrate 110 is not exposed from the thermal oxide film 120.

Figure 18D:
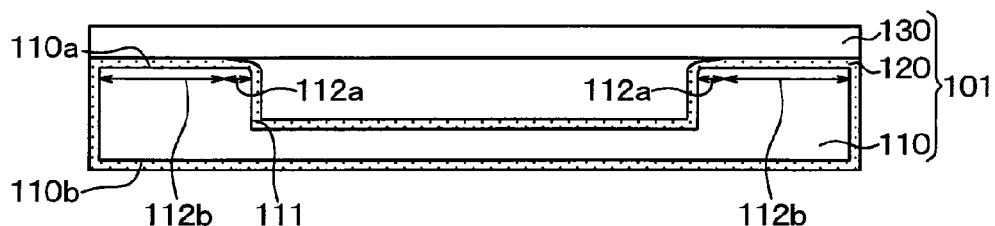

After that, as shown in FIG. 18D, the thermal oxide film 120 formed on one surface 110a side of the supporting substrate 110 and the semiconductor layer 130 are bonded to each other to form the SOI substrate 101. Specifically, since the thickness of the portion of the thermal oxide film 120 formed in the boundary area 112a is smaller than the thickness of the portion thereof formed in the periphery area 112b, the portion of the thermal oxide film 120 formed in the periphery area 112b and the semiconductor layer 130 are bonded to each other. Accordingly, since the area of the periphery area 112b is set to be greater than the area of the boundary area 112a, adhesiveness between the thermal oxide film 120 and the semiconductor layer 130 can be improved.

The method of bonding between the thermal oxide film 120 and the semiconductor layer 130 is not particularly limited, but the bonding, for example, can be performed as follows. That is, first, the surface (bonding surface) of the thermal oxide film 120 and the surface (bonding surface) of the semiconductor layer 130 are irradiated with $N_2$ plasma, $O_2$ plasma, or Ar ion beam and each surface (bonding surface) of the thermal oxide film 120 and the semiconductor layer 130 is activated. Then, alignment is performed with an infrared microscope using alignment marks which are suitably formed, and the thermal oxide film 120 and the semiconductor layer 130 are bonded to each other by a so-called direct bonding at a low temperature of a room temperature to 1550° C.

The direct bonding is described as an example herein, but the thermal oxide film 120 and the semiconductor layer 130 may be bonded by bonding techniques of anodic bonding or intermediate layer bonding. After the bonding, a process for improving bonding quality such as high temperature annealing may be performed. In addition, after the bonding, the semiconductor layer 130 may be processed to have a desired thickness by polishing and grinding.

Figure 18E:
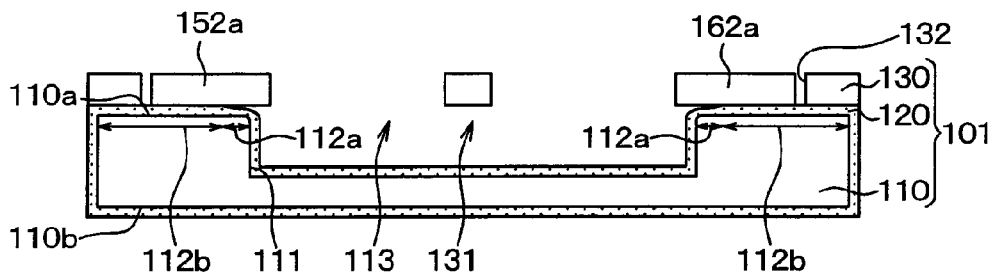

After that, as shown in FIG. 18E, a resist (not shown) is formed on the semiconductor layer 130 and dry etching or the like is performed using the resist as a mask to form the groove 132. Accordingly, the sensing unit 131 including the movable unit 140 and the first and second fixed units 150 and 160 is formed on the semiconductor layer 130 and the acceleration sensor is produced. In this step, the rough bottom portion of the recessed portion 111 can be prevented by using the thermal oxide film 120 as an etching stopper.

As described above, in this embodiment, after performing thermal oxidation of the supporting substrate 110 and forming the thermal oxide film 120, the thickness of the portion of the thermal oxide film 120 formed in the boundary area 112a is set to be smaller than the thickness of the portion thereof formed in the periphery area 112b. The SOI substrate 101 is configured by bonding the portion of the thermal oxide film 120 formed in the periphery area 112b and the semiconductor layer 130 to each other. Accordingly, adhesiveness between the thermal oxide film 120 and the semiconductor layer 130 can be improved, compared to the SOI substrate in the related art.

The relaxation space 170 is configured between the boundary portion 120a linking the portion of the thermal oxide film 120 formed along one surface 110a of the supporting substrate 110 and the portion thereof formed along the wall surface of the recessed portion 111, and the semiconductor layer 130. Accordingly, when the thermal oxide film 120 is expanded due to a change in the usage environment to a high temperature, the thermal oxide film 120 can be expanded to the relaxation space 170 and generation of thermal stress between the thermal oxide film 120 and the semiconductor layer 130 can be prevented.

Ninth Embodiment

Ninth Embodiment of the present disclosure will be described. In this embodiment, the thickness of the portion of the thermal oxide film 120 formed in the boundary area 112a is set to be equivalent to the thickness of the portion thereof formed in the periphery area 112b unlike Eighth Embodiment, and other configurations are the same as the configurations of Eighth Embodiment, and therefore the description thereof will be omitted.

Figure 20A:
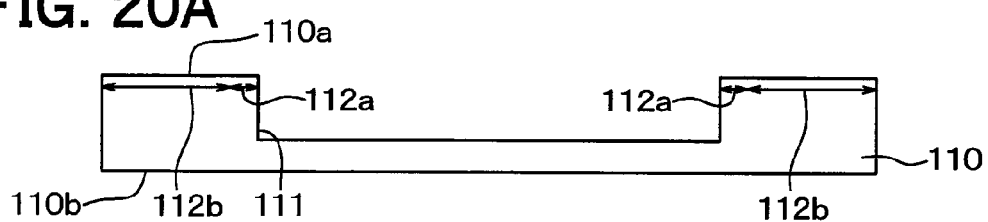
FIGS. 20A to 20F are cross-sectional views showing manufacturing steps of an acceleration sensor of Ninth Embodiment of the present disclosure.

In this embodiment, first, as shown in FIG. 20A, the same step is performed as in FIG. 18A, and the recessed portion 111 is formed on the supporting substrate 110.

Figure 20B:
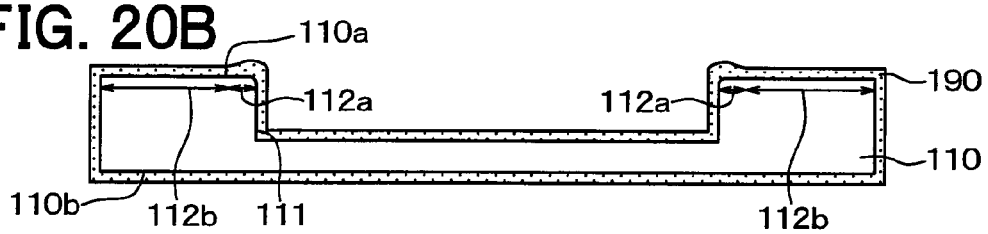

Next, as shown in FIG. 20B, in order to round the opening of the recessed portion 111 on the supporting substrate 110, the supporting substrate 110 is subjected to thermal oxidation to form a rounding insulating film 190. Since the main object of this step is for rounding the opening of the recessed portion 111, the heating temperature may be lower and the heating time may be shorter than those in the thermal oxidation performed in the step of FIG. 17B. In addition, since stress is also concentrated in the boundary area 112a of the supporting substrate 110 in this step, the rounding insulating film 190 which is thicker than the periphery area 112b is formed.

Figure 20C:
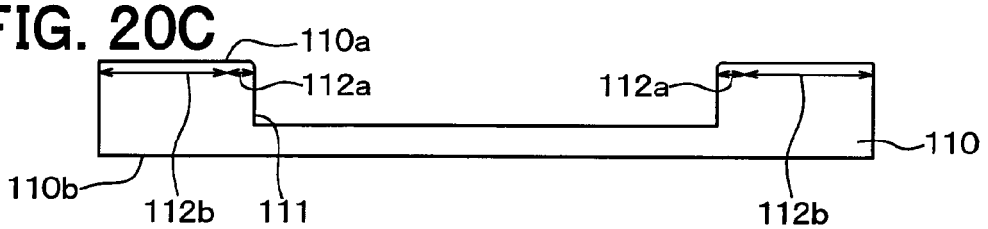

As shown in FIG. 20C, the rounding insulating film 190 formed in the step of FIG. 20B is removed by wet etching or the like.

Figure 20D:
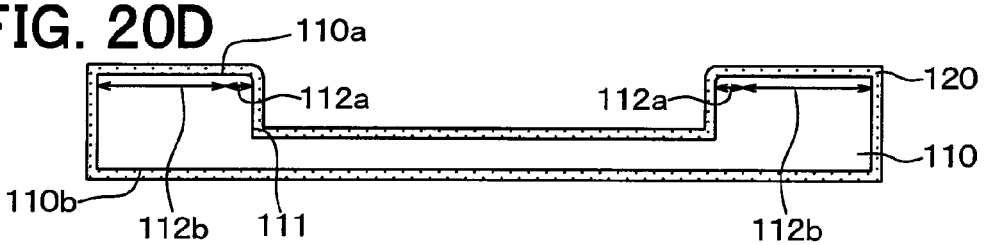

Next, as shown in FIG. 20D, the same step as FIG. 18B is performed and the supporting substrate 110 is subjected to thermal oxidation to form the thermal oxide film 120 on the entire surface of the supporting substrate 110. At that time, in the step of FIG. 20B, since the opening of the recessed portion 111 is rounded, the concentration of stress on the boundary area 112a (opening of the recessed portion 111) at the time of thermal oxidation can be prevented. Accordingly, the thermal oxide film 120 having the substantially the equivalent thickness is formed on one surface 110a of the supporting substrate 110. That is, the thickness of the portion of the thermal oxide film 120 formed in the boundary area 112a is set to be substantially equivalent to the thickness of the portion thereof formed in the periphery area 112b.

The step of FIG. 20D is performed in a state where the opening of the recessed portion 111 is rounded. Accordingly, the boundary portion 120a linking the portion of thermal oxide film 120 formed along one surface 110a of the supporting substrate 110 and the portion thereof formed along the wall surface of the recessed portion 111, is formed along the rounded opening of the recessed portion 111 (see FIG. 21). That is, the boundary portion 120a linking the portion of thermal oxide film 120 formed along one surface 110a of the supporting substrate 110 and the portion thereof formed along the wall surface of the recessed portion 111, has a rounded surface on the side opposite to the supporting substrate 110.

Figure 20E:
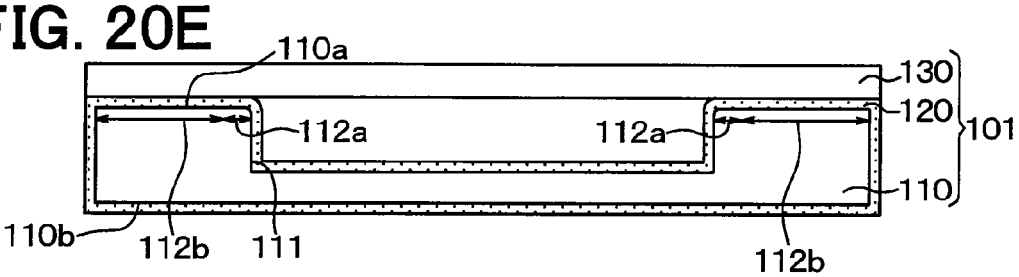

Next, as shown in FIG. 20E, the same step as FIG. 18D is performed, and the thermal oxide film 120 and the semiconductor layer 130 are bonded to each other. In this embodiment, in the step of FIG. 20D, the thickness of the portion of the thermal oxide film 120 formed in the boundary area 112a is set to be equivalent to the thickness of the portion thereof formed in the periphery area 112b. Accordingly, the portion of the thermal oxide film 120 formed in the boundary area 112a and the portion thereof formed in the periphery area 112b are bonded to the semiconductor layer 130.

Figure 20F:
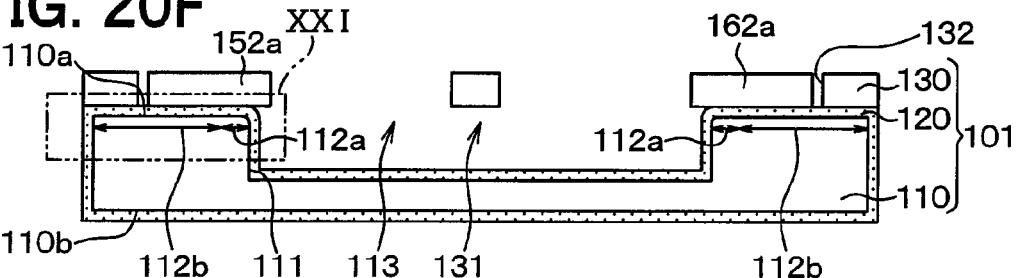

After that, as shown in FIG. 20F, the acceleration sensor is produced by performing the same step as FIG. 18E.

Figure 21:
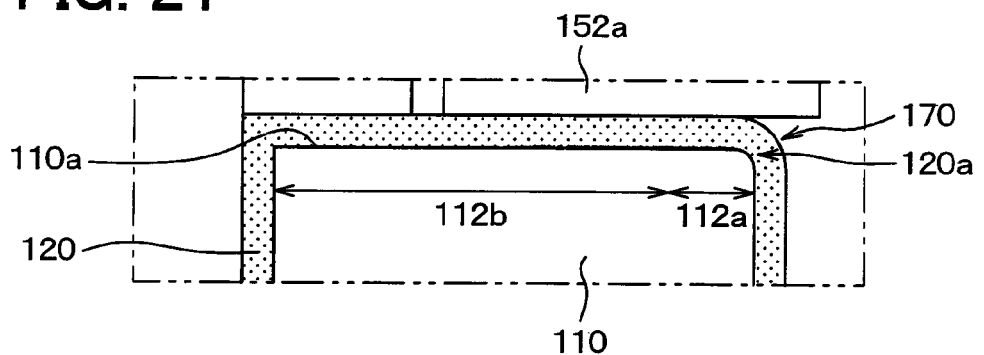
FIG. 21 is an enlarged view of an area XXI in FIG. 20F.

Even in this embodiment, as shown in FIG. 21, the relaxation space 170 is configured between the boundary portion 120a linking the portion of thermal oxide film 120 formed along one surface 110a of the supporting substrate 110 and the portion thereof formed along the wall surface of the recessed portion 111, and the semiconductor layer 130.

As described above, in this embodiment, since the portions of thermal oxide film 120 formed in the boundary area 112a and formed in the periphery area 112b are bonded to the semiconductor layer 130, the adhesiveness can be further improved and the same effects as those in Eighth Embodiment can be obtained.

Tenth Embodiment

Tenth Embodiment of the present disclosure will be described. In the acceleration sensor of each embodiment described above, acceleration is detected based on a capacitance difference between first capacitance formed between the movable electrode 144 and the first fixed electrode 151 and second capacitance formed between the movable electrode 144 and the second fixed electrode 161. However, in practice, the parasitic capacitance between the first fixed unit 150 (first support unit 152) and the supporting substrate 110 is contained in the first capacitance and the parasitic capacitance between the second fixed unit 160 (second support unit 162) and the supporting substrate 110 is contained in the second capacitance. In this case, when the parasitic capacitance contained in the first capacitance and when the parasitic capacitance contained in the second capacitance are equivalent to each other, the parasitic capacitance is canceled out when calculating the capacitance difference between the first capacitance and the second capacitance, and therefore no particular effects are affected on a detection accuracy. However, lengths of the end portions of the first and second linking units 152a and 162a on the movable unit 140 side which are protruded to the space 113 may be different from each other, due to alignment shift occurred when forming the sensing unit 131. In this case, the parasitic capacitance between the first fixed unit 150 (first support unit 152) and the supporting substrate 110 and the parasitic capacitance between the second fixed unit 160 (second support unit 162) and the supporting substrate 110 are different from each other and the detection accuracy is decreased.

Accordingly, this embodiment is realized to prevent a decrease in the detection accuracy, and other configurations are the same as the configurations of Eighth Embodiment, and therefore the description thereof will be omitted.

Figure 22:
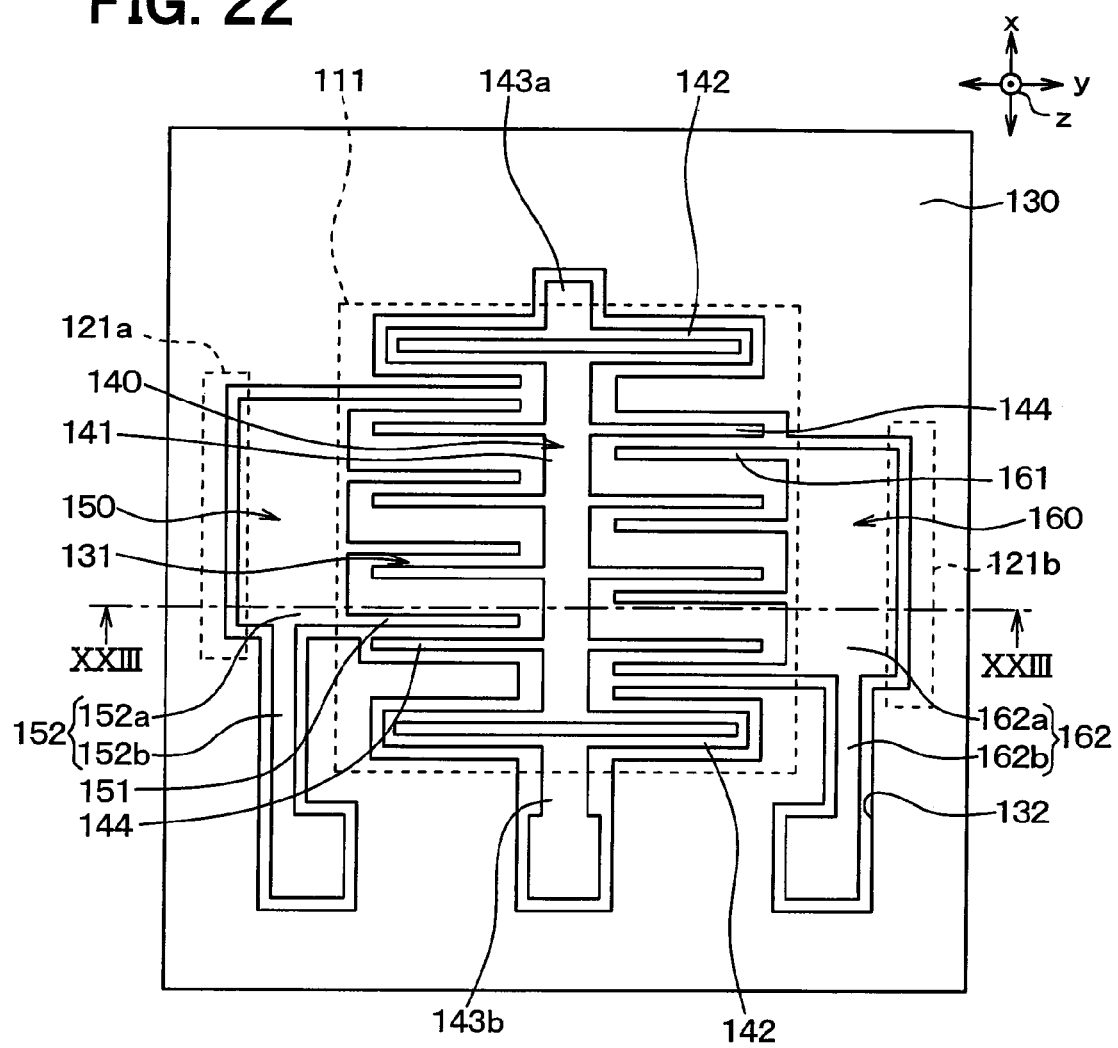
FIG. 22 is a plan view of an acceleration sensor of Tenth Embodiment of the present disclosure.
Figure 23:
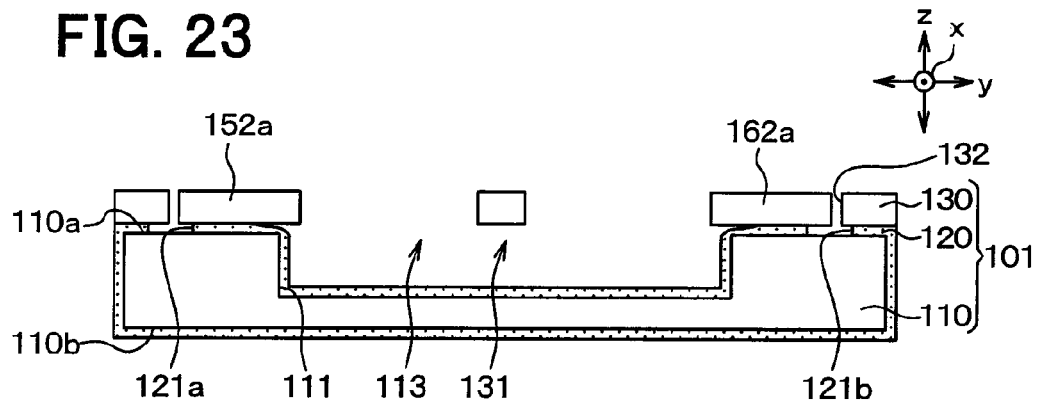
FIG. 23 is a cross-sectional view of the acceleration sensor taken along line XXIII-XXIII of FIG. 22.

In this embodiment, as shown in FIG. 22 and FIG. 23, a first groove portion 121a is formed on the thermal oxide film 120 at a portion opposing the end portion of the first linking unit 152a on the side opposite to the movable unit 140 side. A second groove portion 121b is formed on the thermal oxide film 120 at a portion opposing the end portion of the second linking unit 162a on the side opposite to the movable unit 140 side. Specifically, the first and second groove portions 121a and 121b are provided to be extended in a direction (x axis direction) along the boundary of the bonding portion of the first and second linking units 152a and 162a and the thermal oxide film 120 on the space 113 side (hereinafter, simply referred to as a boundary of the first and second linking units 152a and 162a on the space 113 side).

The end portions of the first and second linking units 152a and 162a on the side opposite to the movable unit 140 side are protruded from the first and second groove portions 121a and 121b. In detail, the first linking unit 152a is protruded from the first groove portion 121a so that a direction and a length of a boundary between the first linking unit 152a (first support unit 152) and the opening of the first groove portion 121a is equivalent to a direction and a length of a boundary between the first linking unit 152a (first support unit 152) on the space 113 side. In the same manner as described above, the second linking unit 162a is protruded from the second groove portion 121b so that a direction and a length of a boundary between the second linking unit 162a (second support unit 162) and the opening of the second groove portion 121b is equivalent to a direction and a length of a boundary between the second linking unit 162a (second support unit 162) on the space 113 side.

The first and second support units 152 and 162 formed of the first and second linking units 152a and 162a and the first and second connection units 152b and 162b are respectively set to have areas of the portions (areas of the portions opposing) bonded with the supporting substrate 110 through the thermal oxide film 120 to be equivalent to each other. That is, the parasitic capacitance formed between the first support unit 152 (first fixed unit 150) and the supporting substrate 110 and the parasitic capacitance formed between the second support unit 162 (second fixed unit 160) and the supporting substrate 110 are set to be equivalent to each other.

The equivalent state of the directions and the lengths of the boundary and the equivalent state of the areas herein include slight error generated due to a manufacturing error or the like, in addition to a case where those completely coincide with each other.

The acceleration sensor is produced by forming the first and second groove portions 121a and 121b on the thermal oxide film 120 in the step of FIG. 18B and forming the sensing unit 131 in the step of FIG. 18E.

In the step of FIG. 18E, several µm position shift may occur when patterning the mask (resist), for example, and the positions of the movable unit 140 and the first and second fixed units 150 and 160 may be generally shifted to the first fixed unit 150 side (in the y axis direction). In this case, as shown in FIG. 24A, a length $L_3$ of the portion of the first linking unit 152a protruded from the space 113 is decreased and a length $L_4$ of the portion thereof protruded from the first groove portion 121a is increased.

Figure 24A:
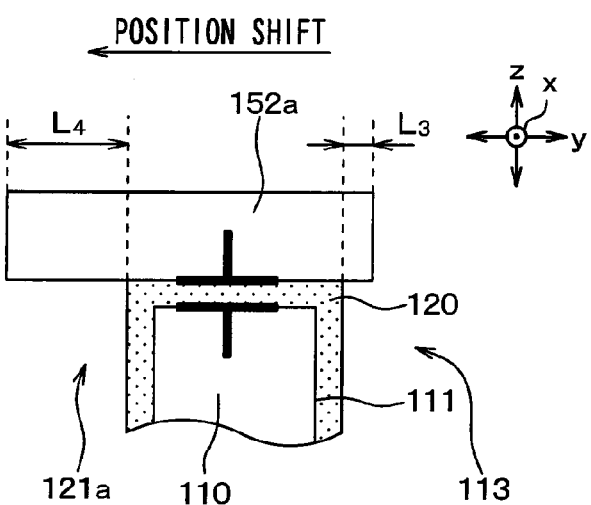
FIG. 24A is a cross-sectional view of a periphery of a first support unit when position shift has not occurred in the step of FIG. 18E
Figure 24B:
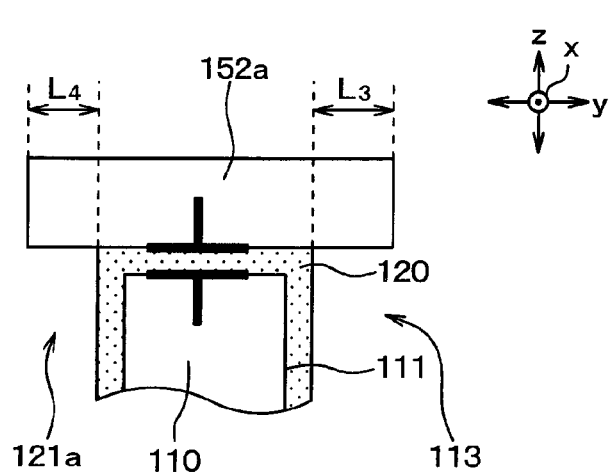
FIG. 24B is a cross-sectional view of a periphery of a first support unit when position shift has occurred in the step of FIG. 18E.

However, the sum of the lengths of the portions of the first linking unit 152a protruded from the space 113 and the first groove portion 121a is equivalent in a case where the position shift has not occurred (FIG. 24B) and a case where the position shift has occurred (FIG. 24A). That is, the area of the portion of the first linking unit 152a which is bonded with the supporting substrate 110 through the thermal oxide film 120 (area of the portion opposing the supporting substrate 110) is not changed and the parasitic capacitance formed between the first linking unit 152a and the supporting substrate 110 is not changed either.

In the same manner as described above, although not particularly shown, even when the position shift has occurred, the sum of the lengths of the portions of the second linking unit 162a protruded from the space 113 and the second groove portion 121b is not changed and the parasitic capacitance formed between the second linking unit 162a and the supporting substrate 110 is not changed.

That is, the lengths (widths) of the first and second groove portions 121a and 121b in the y axis direction are provided to be greater than the amount of the position shift which may occur in the manufacturing process, in advance, and accordingly, the change in the parasitic capacitance can be prevented, even when the position shift has occurred, as described above. Therefore, by manufacturing the acceleration sensor as described above, an acceleration sensor in which the parasitic capacitance is not changed can be provided, even when the position shift has occurred.

As described above, in this embodiment, the first and second groove portions 121a and 121b are formed and a part of each of the first and second support units 152 and 162 is protruded from the space 113 and the first and second groove portions 121a and 121b. The areas of the portions of the first and second support units (areas of the portions opposing) bonded with the supporting substrate 110 through the thermal oxide film 120 are set to be equivalent to each other. Accordingly, the parasitic capacitances formed between the first and second support units 152 and 162 (first and second fixed units 150 and 160) and the supporting substrate 110 are equivalent to each other and generation of a detection error is prevented.

When manufacturing the acceleration sensor, the first groove portion 121a is formed and the first fixed unit 150 is formed so that the end portion of the first linking unit 152a on the movable unit 140 side is protruded from the space 113 and the end portion thereof on the side opposite to the movable unit 140 side is protruded from the first groove portion 121a. The second groove portion 121b is formed and the second fixed unit 160 is formed so that the end portion of the second linking unit 162a on the movable unit 140 side is protruded from the space 113 and the end portion thereof on the side opposite to the movable unit 140 side is protruded from the second groove portion 121b.

Accordingly, when forming the movable unit 140 and the first and second fixed units 150 and 160, the areas of the portions of the first and second support units 152 and 162 which are bonded with the supporting substrate 110 through the thermal oxide film 120 (areas of the portions opposing the supporting substrate 110) are not changed, even when the positions of the movable unit 140 and the first and second fixed units 150 and 160 are generally shifted in the y axis direction. That is, the parasitic capacitance formed between the first and second support units 152 and 162 (first and second fixed units 150 and 160) and the supporting substrate 110 is not changed. Therefore, an acceleration sensor in which the parasitic capacitance is not changed and the generation of the detection error is prevented can be produced, even when the position shift has occurred.

In the above description, the position shift in the y axis direction has been described as an example, but according to this embodiment, an acceleration sensor in which the parasitic capacitance is not changed and a decrease in the detection accuracy is prevented even when the position shift in the x axis direction and a rotation direction around the z axis direction which may occur in the manufacturing process has occurred can be produced.

Other Embodiment

The present disclosure is not limited to this embodiments described above and modifications can be suitably performed within a range of the claims.

That is, in First to Seventh Embodiments, the acceleration sensor in which the sensing unit 15 for detecting acceleration is formed has been described as an example of the capacitance type physical quantity sensor, but the disclosure of the First to Seventh Embodiments can be applied to a sensor which detects physical quantity using a capacitance difference. For example, the disclosure can be applied to an angular velocity sensor which detects angular velocity or a pressure sensor which detects pressure based on a capacitance difference.

Third Embodiment can be combined with Second and Fifth to Seventh Embodiments. That is, in the capacitance type physical quantity sensor including cap 50, the first and second recess 19a and 19b may be formed in the supporting substrate 11 and the insulating film 12. In this case, although not particularly shown, the first and second recesses corresponding to the first and second recesses 19a and 19b may be formed in the semiconductor substrate 51 and the insulating film 52. Fourth Embodiment can be combined with Second and Fifth to Seventh Embodiments. That is, in the capacitance type physical quantity sensor including cap 50, the first and second holes 71 and 72 may be formed on the first and second linking units 32a and 42a. In addition, Second to Fourth Embodiments may be suitably combined with each other.

In Second and Fifth to Seventh Embodiments, the recessed portion 17 is formed only in the insulating film 12 and the first and second groove portions 18a and 18b may not be formed. In this case, the SOI substrate 14 corresponds to the first substrate of the capacitance type physical quantity sensor and the cap 50 corresponds to the second substrate of the capacitance type physical quantity sensor.

In Eighth Embodiment, in the step of FIG. 18C, the thermal oxide film 120 formed on one surface 110a of the supporting substrate 110 may be flattened by polishing and grinding from the one surface 110a of the supporting substrate 110. That is, the thickness of the portion of the thermal oxide film 120 formed in the boundary area 112a may be set to be equivalent to the thickness of the portion thereof formed in the periphery area 112b.

In Eighth and Ninth Embodiment, the acceleration sensor which detects acceleration has been described as an example of the physical quantity sensor, but the disclosure can be applied to an angular velocity sensor which detects angular velocity or a pressure sensor which detects pressure, for example. In Tenth Embodiment, the disclosure can be applied to an angular velocity sensor or a pressure sensor which detects the physical quantity using the capacitance difference, as the physical quantity sensor.

In addition, Tenth Embodiment may be combined with Ninth Embodiment and the first and second groove portions 121a and 121b may be formed in the thermal oxide film 120.

The invention claimed is:

1. A SOI substrate manufacturing method, comprising:
preparing a first substrate made of a silicon substrate having one surface;
forming a recessed portion on the one surface of the first substrate;
performing thermal oxidation of the first substrate, and forming a thermal oxide film; and
bonding a second substrate to the one surface of the first substrate through the thermal oxide film, wherein:
after the forming of the thermal oxide film, when a periphery portion of the one surface of the first substrate around an opening of the recessed portion is set as a boundary area, and an area of the one surface of the first substrate surrounding the boundary area and being greater than the area of the boundary area is set as a periphery area, adjusting of the thermal oxide film to set a thickness of a portion of the thermal oxide film formed in the boundary area to be equal to or smaller than a thickness of a portion of the thermal oxide film formed in the periphery area is performed; and
the portion of the thermal oxide film formed in the periphery area is bonded with the second substrate in the bonding of the second substrate.

2. The SOI substrate manufacturing method according to claim 1, wherein:
the adjusting of the thermal oxide film includes:
thinning the portion of the thermal oxide film formed in the boundary area using a resist as a mask after forming the resist to expose the portion of the thermal oxide film formed in the boundary area from the one surface of the first substrate,
so that the thickness of the portion of the thermal oxide film formed in the boundary area is set to be equal to or smaller than the thickness of the portion of the thermal oxide film formed in the periphery area.

3. The SOI substrate manufacturing method according to claim 1, wherein:
the adjusting of the thermal oxide film includes:
polishing and grinding the portion of the thermal oxide film formed in the boundary area from the one surface of the first substrate,
so that the thickness of the portion of the thermal oxide film formed in the boundary area is set to be equal to or smaller than the thickness of the portion of the thermal oxide film formed in the periphery area.

4. The SOI substrate manufacturing method according to claim 1, wherein:
in the forming the thermal oxide film, an opening of the recessed portion is rounded by forming the thermal oxide film; and
in the adjusting of the thermal oxide film, removing of the thermal oxide film and forming of a thermal oxide film again by thermal oxidizing the first substrate are performed, so that the thickness of the portion of the thermal oxide film formed in the boundary area is set to be equal to or smaller than the thickness of the portion of the thermal oxide film formed in the periphery area.

5. A physical quantity sensor manufacturing method comprising:
preparing a SOI substrate, which is manufactured by the manufacturing method according claim 1; and
forming a sensing unit on the second substrate, the sensing unit including: a movable unit which has a plurality of movable electrodes being displaceable in a predetermined direction; a first fixed unit which has a first support unit with a plurality of first fixed electrodes respectively facing the movable electrodes; and a second fixed unit which has a second support unit with a plurality of second fixed electrodes respectively facing the movable electrodes, and the second support unit being disposed on a side opposite to the first support unit by sandwiching the movable unit between the second and first support units, wherein:
the adjusting of the thermal oxide film in the preparing of the SOT substrate includes: forming a first groove portion at a place of the thermal oxide film facing an end portion of the first support unit on a side opposite to the movable unit, and forming a second groove portion at a place of the thermal oxide film facing an end portion of the second support unit on a side opposite to the movable unit; and
the forming of the sensing unit includes:
forming the first fixed unit in such a manner that a part of another end portion of the first support unit on a side of the movable unit protrudes in a space surrounded by the thermal oxide film and formed on a wall surface of the recessed portion, and a part of the end portion of the first support unit on the side opposite to the movable unit protrudes over the first groove portion; and
forming the second fixed unit in such a manner that a part of another end portion of the second support unit on the side of the movable unit protrudes in the space, and a part of the end portion of the second support unit on the side opposite to the movable unit protrudes over the second groove portion,
so that an area of a portion of the first support unit bonded to the first substrate through the thermal oxide film is equivalent to an area of a portion of the second support unit bonded to the first substrate through the thermal oxide film.

6. A SOT substrate comprising:
a first substrate that includes one surface and is made of a silicon substrate where a recessed portion is arranged on the one surface;
a thermal oxide film that is arranged on the first substrate; and
a second substrate that is disposed on the one surface of the first substrate through the thermal oxide film, wherein:
a periphery portion of the one surface of the first substrate around the opening of the recessed portion is set as a boundary area;
an area of the one surface of the first substrate surrounding the boundary area and being greater than the area of the boundary area is set as a periphery area;
a thickness of a portion of the thermal oxide film arranged in the boundary area is set to be equal to or smaller than a thickness of a portion of the thermal oxide film arranged in the periphery area;
the second substrate is bonded to the portion of the thermal oxide film arranged in the periphery area; and
a relaxation space is arranged between the second substrate and a boundary portion, which links a portion of the thermal oxide film arranged on the one surface and a portion of the thermal oxide film arranged on the wall surface of the recessed portion.

7. A physical quantity sensor comprising:
the SOI substrate according to claim 6; and
a sensing unit including: a movable unit which has a plurality of movable electrodes being displaceable in a predetermined direction; a first fixed unit which has a first support unit with a plurality of first fixed electrodes respectively facing the movable electrodes; and a second fixed unit which has a second support unit with a plurality of second fixed electrodes respectively facing the movable electrodes, the second support unit being disposed on a side opposite to the first support unit by sandwiching the movable unit between the second and first support units, wherein:
a first groove portion is arranged at a place of the thermal oxide film facing an end portion of the first support unit on a side opposite to the movable unit, and a second groove portion is arranged at a place of the thermal oxide film facing an end portion of the second support unit on the side opposite to the movable unit;
a part of another end portion of the first support unit on a side of the movable unit protrudes in a space surrounded by the thermal oxide film arranged on the wall surface of the recessed portion, and a part of the end portion of the first support unit on the side opposite to the movable unit protrudes over the first groove portion;
a part of another end portion of the second support unit on the side of the movable unit protrudes in the space, and a part of the end portion of the second support unit on the side opposite to the movable unit protrudes over the second groove portion; and
an area of a portion of the first support unit bonded to the first substrate through the thermal oxide film is equivalent to an area of a portion of the second support unit bonded to the first substrate through the thermal oxide film.

* * * * *